United States Patent
Lamb et al.

(10) Patent No.: US 9,384,737 B2
(45) Date of Patent: Jul. 5, 2016

(54) METHOD AND DEVICE FOR ADJUSTING SOUND LEVELS OF SOURCES BASED ON SOUND SOURCE PRIORITY

(75) Inventors: Mathew J. Lamb, Mercer Island, WA (US); Ben J. Sugden, Woodinville, WA (US); Robert L. Crocco, Jr., Seattle, WA (US); Brian E. Keane, Bellevue, WA (US); Christopher E. Miles, Seattle, WA (US); Kathryn Stone Perez, Kirkland, WA (US); Laura K. Massey, Redmond, WA (US); Alex Aben-Athar Kipman, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 325 days.

(21) Appl. No.: 13/538,731

(22) Filed: Jun. 29, 2012

(65) Prior Publication Data

US 2014/0006026 A1    Jan. 2, 2014

(51) Int. Cl.
| | |
|---|---|
| G10L 17/20 | (2013.01) |
| G10L 15/20 | (2006.01) |
| G10L 21/02 | (2013.01) |
| G10L 17/00 | (2013.01) |
| H03G 3/10 | (2006.01) |

(52) U.S. Cl.
CPC . *G10L 17/00* (2013.01); *H03G 3/10* (2013.01)

(58) Field of Classification Search
CPC ......... G10L 17/00; G10L 17/20; G10L 21/02; G10L 15/20
USPC ............ 704/225, 226, 227, 233, 246; 381/57, 381/92, 313
See application file for complete search history.

(56) References Cited

U.S. PATENT DOCUMENTS

| | | | |
|---|---|---|---|
| 3,975,080 A | 8/1976 | Norman | |
| 5,651,071 A * | 7/1997 | Lindemann et al. | .......... 704/226 |
| 6,181,351 B1 | 1/2001 | Merrill et al. | |
| 6,429,867 B1 | 8/2002 | Deering | |
| 6,463,414 B1 * | 10/2002 | Su et al. | ..................... 704/270.1 |

(Continued)

OTHER PUBLICATIONS

Baldassari, et al., "An Open Source Engine for Embodied Animated Agents", In Proceeding of Congreso Espanol de Informatica Grafica, 2007, pp. 89-98.

(Continued)

*Primary Examiner* — Martin Lerner
(74) *Attorney, Agent, or Firm* — Dan Choi; Judy Yee; Micky Minhas

(57) ABSTRACT

A system for generating one or more enhanced audio signals such that one or more sound levels corresponding with sounds received from one or more sources of sound within an environment may be dynamically adjusted based on contextual information is described. The one or more enhanced audio signals may be generated by a head-mounted display device (HMD) worn by an end user within the environment and outputted to earphones associated with the HMD such that the end user may listen to the one or more enhanced audio signals in real-time. In some cases, each of the one or more sources of sound may correspond with a priority level. The priority level may be dynamically assigned depending on whether the end user of the HMD is focusing on a particular source of sound or has specified a predetermined level of importance corresponding with the particular source of sound.

15 Claims, 15 Drawing Sheets

(56) References Cited

U.S. PATENT DOCUMENTS

| | | | |
|---|---|---|---|
| 6,772,122 B2 | 8/2004 | Jowitt et al. | |
| 7,050,078 B2 | 5/2006 | Dempski | |
| 7,164,076 B2 | 1/2007 | McHale et al. | |
| 7,613,613 B2 | 11/2009 | Fields et al. | |
| 7,752,050 B1* | 7/2010 | Hameed et al. | 704/275 |
| 7,756,274 B2* | 7/2010 | Layton | H04R 27/00 381/310 |
| 7,783,077 B2 | 8/2010 | Miklos et al. | |
| 7,847,699 B2 | 12/2010 | Lee | |
| 8,121,310 B2* | 2/2012 | Amada | H04R 3/005 381/92 |
| 8,315,366 B2* | 11/2012 | Basart et al. | 704/276 |
| 8,615,092 B2* | 12/2013 | Matsuo | H04S 7/30 381/56 |
| 8,861,756 B2* | 10/2014 | Zhu | H04R 3/005 381/57 |
| 2003/0012410 A1 | 1/2003 | Navab et al. | |
| 2003/0110026 A1 | 6/2003 | Yamamoto | |
| 2005/0240407 A1* | 10/2005 | Simske et al. | 704/246 |
| 2006/0147058 A1 | 7/2006 | Wang | 381/104 |
| 2008/0004872 A1* | 1/2008 | Nordholm et al. | 704/226 |
| 2009/0043579 A1* | 2/2009 | Chaudhari et al. | 704/246 |
| 2009/0055178 A1* | 2/2009 | Coon | 704/246 |
| 2009/0196459 A1 | 8/2009 | Watt et al. | |
| 2009/0220065 A1* | 9/2009 | Ahuja et al. | 379/202.01 |
| 2009/0235162 A1 | 9/2009 | Nuccio et al. | |
| 2009/0262946 A1* | 10/2009 | Dunko | H04S 1/002 381/17 |
| 2009/0279715 A1* | 11/2009 | Jeong | H04R 3/005 381/92 |
| 2010/0060662 A1 | 3/2010 | Law | |
| 2010/0100851 A1 | 4/2010 | Clark et al. | |
| 2010/0149609 A1 | 6/2010 | Schwerdtner | |
| 2010/0253700 A1 | 10/2010 | Bergeron | |
| 2010/0257252 A1 | 10/2010 | Dougherty et al. | |
| 2010/0316232 A1* | 12/2010 | Acero | H04R 27/00 381/92 |
| 2011/0126140 A1 | 5/2011 | Danilov | |
| 2011/0187814 A1* | 8/2011 | Nimri et al. | 704/275 |
| 2011/0216060 A1 | 9/2011 | Weising et al. | |
| 2012/0101819 A1* | 4/2012 | Heiman et al. | 704/233 |
| 2012/0214544 A1* | 8/2012 | Shivappa | H04M 1/72572 381/92 |
| 2012/0224714 A1* | 9/2012 | Couse | H04R 1/406 381/92 |
| 2012/0259631 A1* | 10/2012 | Lloyd et al. | 704/233 |
| 2012/0330659 A1* | 12/2012 | Nakadai | 704/275 |
| 2013/0018659 A1* | 1/2013 | Chi | 704/275 |
| 2013/0024196 A1* | 1/2013 | Ganong et al. | 704/246 |
| 2013/0041648 A1* | 2/2013 | Osman | H04S 7/302 704/2 |
| 2013/0124204 A1* | 5/2013 | Wong | G01S 3/8036 704/235 |
| 2013/0156220 A1* | 6/2013 | Bar-Zeev et al. | 381/92 |
| 2013/0162752 A1* | 6/2013 | Herz et al. | 348/14.08 |
| 2013/0201185 A1* | 8/2013 | Kochi | 345/419 |
| 2013/0304479 A1* | 11/2013 | Teller et al. | 704/275 |
| 2014/0010391 A1* | 1/2014 | Ek | G06F 3/011 381/310 |

OTHER PUBLICATIONS

Desbiens, Jacques, "Experiments in Image Composition for Synthetic Holography", In Proceedings of the 8th International Symposium on Display Holography, Jul. 13, 2009, pp. 1-9.

Ercan, et al., "On Sensor Fusion for Head Tracking in Augmented Reality Applications", In American Control Conference, Jun. 29, 2011, pp. 1286-1291.

Friedland, et al., "Text Book on Fundamentals of Multimedia Computing", Retrieved on: Feb. 14, 2012, Available at: http://mm-creole.wikispaces.com/file/view/Chapter_Context_and_Content_100804.pdf.

Gould, et al., "Integrating Visual and Range Data for Robotic Object Detection", In ECCV Workshop on Multi-camera and Multi-modal Sensor Fusion Algorithms and Applications (M2SFA2), Oct. 18, 2008, pp. 434-455.

Guo, et al., "Sixth-Sense: Context Reasoning for Potential Objects Detection in Smart Sensor Rich Environment", In Proceedings of the IEEE/WIC/ACM International Conference on Intelligent Agent Technology, Dec. 18, 2006, pp. 191-194.

Hoiem, et al., "3D LayoutCRF for Multi-View Object Class Recognition and Segmentation", In Proceedings of the IEEE Conference on Computer Vision and Pattern Recognition, Jun. 17, 2007, pp. 1-8.

Martin, et al., "Evaluation of Holographic Technology in Close Air Support Mission Planning and Execution", Published on: Jun. 2008, Available at:http://www.dtic.mil/cgi-bin/GetTRDoc?AD=ADA486177.

Nakamura, et al., "A Method for Estimating Position and Orientation with a Topological Approach using Multiple Infrared Tags", In Proceedings of Fourth International Conference on Networked Sensing Systems, Jun. 6, 2002, pp. 187-195.

Reallusion, "Crazy Talk 6 (PC DVD)", Published on: Apr. 12, 2010, Available at: http://www.amazon.co.uk/Crazy-Talk-6-PC-DVD/dp/B002DUCNL4.

Samzenpus, ""Holographic" Desk Allows Interaction with Virtual Objects", Published on: Oct. 26, 2011, Available at: http://tech.slashdot.org/story/11/10/26/1725214/holographic-desk-allows-interaction-with-virtual-objects.

Stone, et al., "Speaking with Hands: Creating Animated Conversational Characters from Recordings of Human Performance", In Proceedings of ACM SIGGRAPH, Aug. 8, 2004, pp. 506-513.

Straczynski, J. Michael, "The Great Maker: (JMS) at San Diego Comic Con '95", Retrieved on: Feb. 13, 2012, Available at:http://ubots.com/b5/jms_on_b5.shtml.

Tanaka et al., "Toward Automatic Construction of Reality-based Virtual Space Simulation", In Proceedings of 12th International Conference on Artificial Reality and Telexistence, Dec. 4, 2002, 6 pages.

Tsiatsis, et al., "Poster Abstract: On the Interaction of Network Characteristics and Collaborative Target Tracking in Sensor Networks", In Proceedings of the 1st International Conference on Embedded Networked Sensor Systems, Nov. 5, 2003, pp. 316-317.

Voice-O-Matic, 2000, www.di-o-matic.com/products/plugins/VoiceOMatic/#page=overview.

Xu, et al., "Computer-Generated Holography for Dynamic Display of 3D Objects with Full Parallax", The International Journal of Virtual Reality, Jun. 2009, pp. 33-38.

Ziegler, et al., "A Framework for Holographic Scene Representation and Image Synthesis", In Proceedings of the IEEE Transactions on Visualization and Computer Graphics, vol. 13, Issue 2, Mar. 2007, pp. 403-415.

* cited by examiner

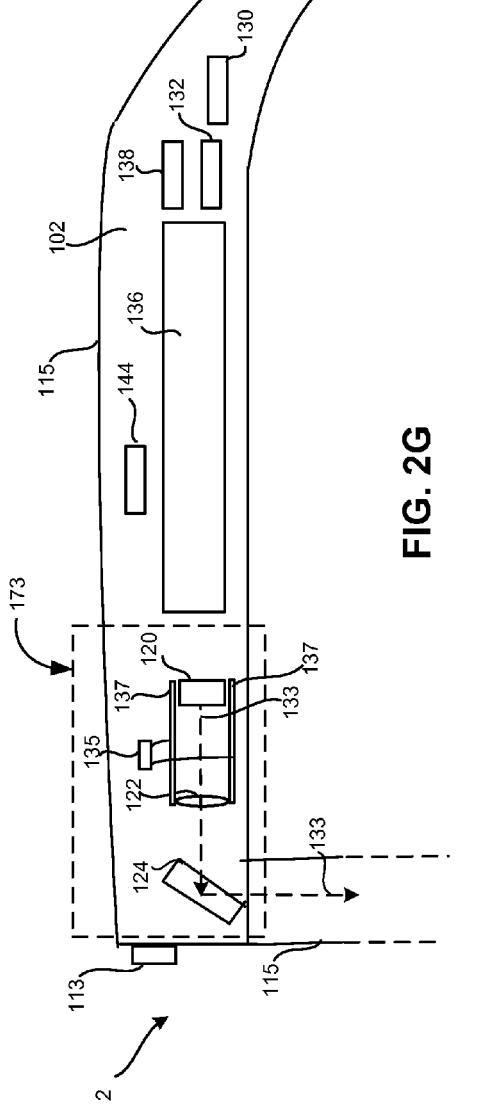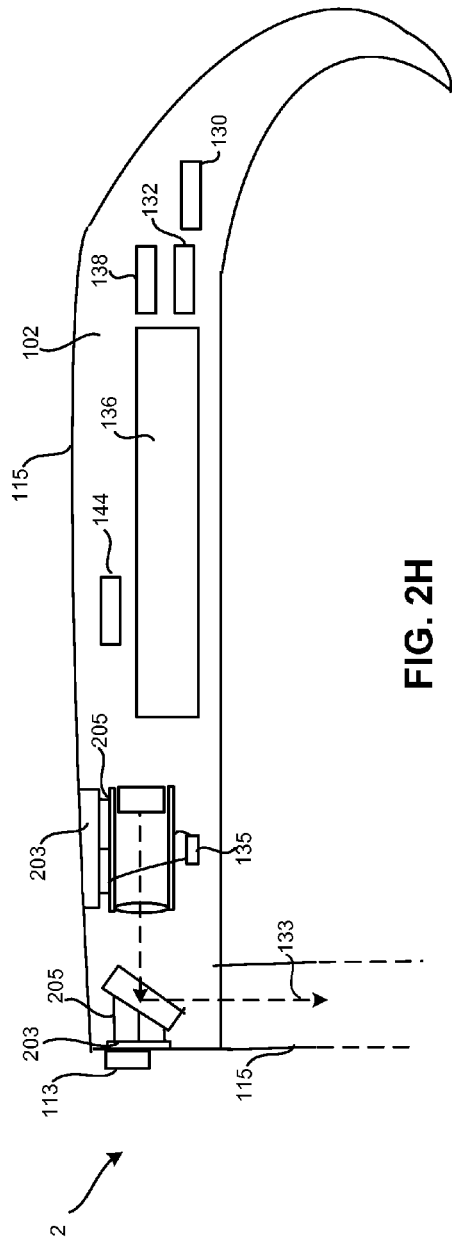

METHOD AND DEVICE FOR ADJUSTING SOUND LEVELS OF SOURCES BASED ON SOUND SOURCE PRIORITY

BACKGROUND

Augmented reality (AR) relates to providing an augmented real-world environment where the perception of a real-world environment (or data representing a real-world environment) is augmented or modified with computer-generated virtual data. For example, data representing a real-world environment may be captured in real-time using sensory input devices such as a camera or microphone and augmented with computer-generated virtual data including virtual images and virtual sounds. Sounds from within an AR environment may originate from real sound sources (i.e., sound sources that exist within a particular real-world environment) and virtual sound sources (i.e., sound sources that do not exist within the particular real-world environment).

In order to realistically integrate virtual sounds into an AR environment, an AR system may perform several tasks including mapping and localization. Mapping relates to the process of generating a map of a real-world environment. Localization relates to the process of locating a particular point of view or pose relative to the map of the real-world environment. In some cases, an AR system may localize the pose of a mobile device moving within a real-world environment in real-time in order to determine the appropriate virtual sound directions and virtual sound intensities for virtual sounds within the AR environment as the mobile device moves within the real-world environment.

SUMMARY

Technology is described for generating one or more enhanced audio signals such that one or more sound levels corresponding with sounds received from one or more sources of sound within an environment may be dynamically adjusted based on contextual information. The one or more enhanced audio signals may be generated in real-time by a head-mounted display device (HMD) worn by an end user within the environment and outputted to earphones associated with the HMD such that the end user may listen to the one or more enhanced audio signals in real-time. In some cases, each of the one or more sources of sound may correspond with a priority level. The priority level may be dynamically assigned depending on whether the end user of the HMD is focusing on a particular source of sound or has specified a predetermined level of importance corresponding with the particular source of sound.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 2G depicts one embodiment of a side view of a portion of an HMD.

FIG. 2H depicts one embodiment of a side view of a portion of an HMD which provides support for a three dimensional adjustment of a microdisplay assembly.

DETAILED DESCRIPTION

Figure 1:
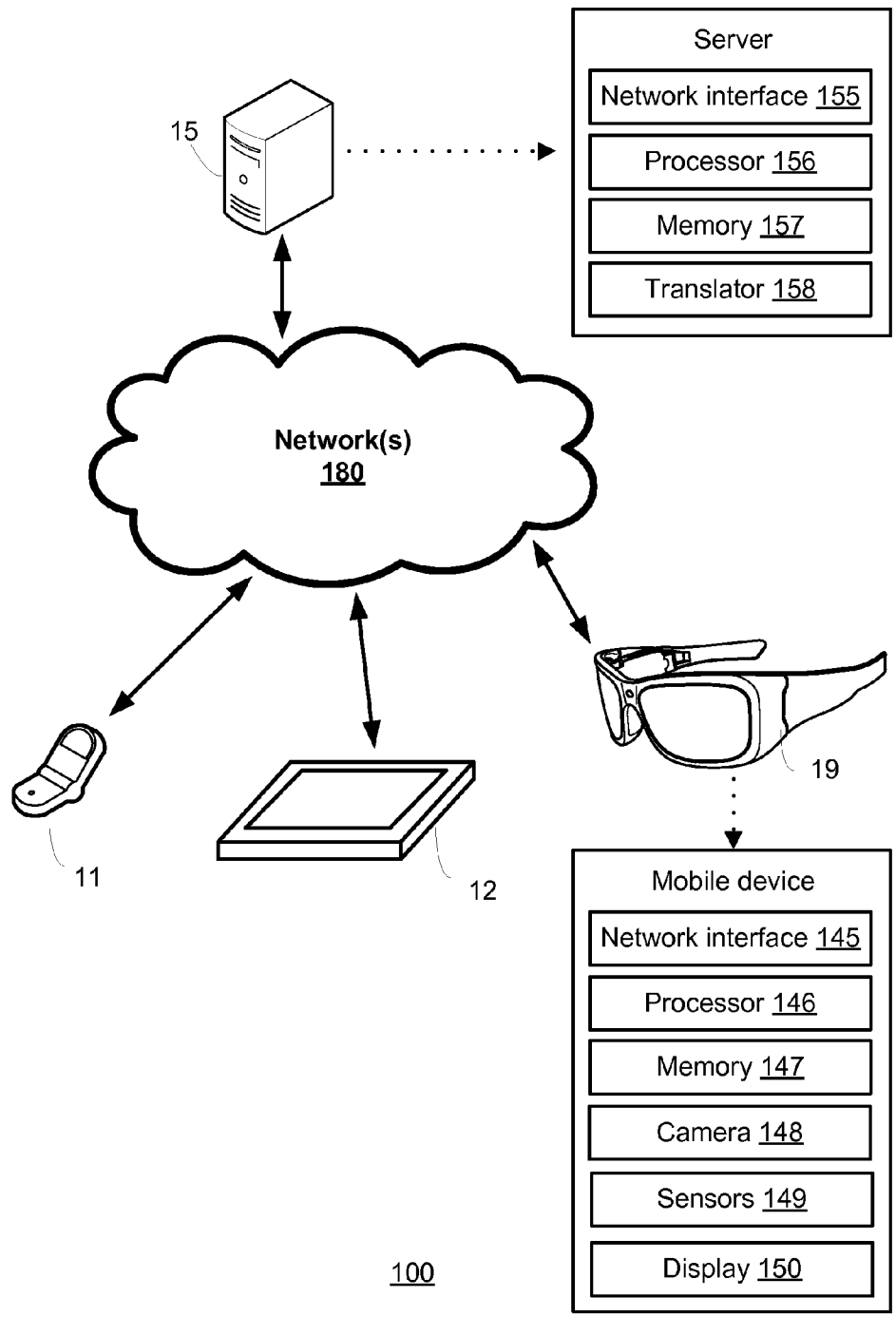
FIG. 1 is a block diagram of one embodiment of a networked computing environment in which the disclosed technology may be practiced.

Technology is described for generating one or more enhanced audio signals such that one or more sound levels corresponding with sounds received from one or more sources of sound within an environment may be dynamically adjusted based on contextual information. The one or more enhanced audio signals may be generated in real-time by a head-mounted display device (HMD) worn by an end user within the environment and outputted to earphones associated with the HMD such that the end user may listen to the one or more enhanced audio signals in real-time. In some cases, each of the one or more sources of sound may correspond with a priority level. The priority level may be dynamically assigned and may depend on whether the end user of the HMD is focusing on a particular source of sound, has been focusing on the particular source of sound for at least a particular period of time, or has specified a predetermined level of importance corresponding with the particular source of sound. The particular source of sound may comprise a particular person within the environment. The particular person may be identified by utilizing voice and/or facial recognition techniques. The one or more enhanced audio signals may be generated by applying audio signal processing techniques to the sounds received from the one or more sources of sound based on priority levels assigned to the one or more sources of sound.

In some embodiments, each of the one or more sources of sound within an environment may be identified (e.g., via object recognition, sound recognition, facial recognition, or voice recognition) and assigned a ranking or priority level corresponding with an inferred level of importance of the source of sound to an end user of an HMD. Each of the one or more sources of sound may be associated with a particular direction (or location) relative to the HMD. The particular direction may be determined using sound source localization techniques. Sound source localization may be used to localize the direction of a sound source by detecting time differences in the arrival time of different sounds (due to the speed of sound) being captured by a plurality of microphones associated with the HMD. Sound source localization techniques may also include performing pattern matching on each of the audio signals received by each of the plurality of microphones. The particular direction may be represented by a one-dimension localization (e.g., an angle representing a plane in which a particular source of sound is located), two-dimension localization (e.g., a vector representing an angle and an elevation), or a three-dimension localization (e.g., locating a point in three-dimension space associated with a particular source of sound). The particular direction associated with a particular source of sound may be used to isolate sounds originating from the particular direction from other sounds within an environment.

In some embodiments, a focused audio signal may be generated corresponding with a particular source of sound within an environment. The focused audio signal may be generated by applying beamforming techniques (e.g., delay and sum beamforming techniques). Beamforming techniques may be performed in order to amplify sounds originating from a particular direction (or location) within the environment and to suppress sounds originating from other directions. Beamforming effectively allows a plurality of microphones (e.g., comprising a microphone array) to function as a steerable directional microphone. In some cases, the beamforming techniques may include time shifting and combining audio signals (e.g., using a weighted sum) associated with a plurality of microphones. The degree of time shifting may be based on a particular direction (or location) associated with the particular source of sound. Sound focusing techniques are particularly useful when more than one person is talking at the same time within an environment.

In some embodiments, a priority level assigned to a particular source of sound may depend on a contextual situation associated with an end user of an HMD. In one example, the contextual situation may involve an identification of a particular person within an environment (e.g., is the particular person a spouse, a boss, or a stranger), an identification of the environment (e.g., is the environment a home environment, a work environment, or a public environment), and an identification of a particular object within the environment focused on by the end user of the HMD (e.g., is the end user looking at or talking to a particular person). The identification of a particular person may be determined by applying voice recognition techniques to sounds originating from the particular person and/or by applying facial recognition techniques to images associated with the particular person. The identification of an environment may be determined by acquiring GPS location information associated with the environment. The identification of a particular object being focused on by an end user of an HMD may be determined by applying gaze detection techniques.

In one embodiment, an end user of an HMD may be in a work environment attending a work-related meeting. In this case, the HMD may identify and amplify sounds originating from a first person being focused on by the end user and a second person corresponding with a boss of the end user, while other sounds originating from other sources of sound within the environment may be attenuated or suppressed (i.e., sounds originating from sources of sound corresponding with higher priority levels may be amplified and/or other sounds originating from other sources of sound corresponding with lower priority levels may be attenuated). Amplification of a particular sound may correspond with an increase in a sound level (or increase in sound volume) of the particular sound. Attenuation of a particular sound may correspond with a decrease in a sound level (or decrease in sound volume) of the particular sound.

In another embodiment, an end user of an HMD may be in a home environment listening to a story associated with an augmentable book being read to them by a particular person. In this case, the HMD may identify an AR tag associated with the augmentable book and play an audio recording (e.g., comprising background music or a particular song) associated with the AR tag. In one example, the AR tag may correspond with a virtual object that may be displayed to and heard by an end user of the HMD (e.g., the virtual object may comprise a virtual monster singing a song). The HMD may detect when the particular person is reading the augmentable book and selectively attenuate sounds associated with the audio recording (e.g., by reducing a sound level associated with the audio recording) only when the particular person is reading the story.

FIG. 1 is a block diagram of one embodiment of a networked computing environment 100 in which the disclosed technology may be practiced. Networked computing environment 100 includes a plurality of computing devices interconnected through one or more networks 180. The one or more networks 180 allow a particular computing device to connect to and communicate with another computing device. The depicted computing devices include mobile device 11, mobile device 12, mobile device 19, and server 15. In some embodiments, the plurality of computing devices may include other computing devices not shown. In some embodiments, the plurality of computing devices may include more than or less than the number of computing devices shown in FIG. 1. The one or more networks 180 may include a secure network such as an enterprise private network, an unsecure network such as a wireless open network, a local area network (LAN), a wide area network (WAN), and the Internet. Each network of the one or more networks 180 may include hubs, bridges, routers, switches, and wired transmission media such as a wired network or direct-wired connection.

Server 15, which may comprise a supplemental information server or an application server, may allow a client to download information (e.g., text, audio, image, and video files) from the server or to perform a search query related to particular information stored on the server. In general, a "server" may include a hardware device that acts as the host in a client-server relationship or a software process that shares a resource with or performs work for one or more clients. Communication between computing devices in a client-server relationship may be initiated by a client sending a request to the server asking for access to a particular resource or for particular work to be performed. The server may subsequently perform the actions requested and send a response back to the client.

One embodiment of server 15 includes a network interface 155, processor 156, memory 157, and translator 158, all in communication with each other. Network interface 155 allows server 15 to connect to one or more networks 180.

Network interface 155 may include a wireless network interface, a modem, and/or a wired network interface. Processor 156 allows server 15 to execute computer readable instructions stored in memory 157 in order to perform processes discussed herein. Translator 158 may include mapping logic for translating a first file of a first file format into a corresponding second file of a second file format (i.e., the second file may be a translated version of the first file). Translator 158 may be configured using file mapping instructions that provide instructions for mapping files of a first file format (or portions thereof) into corresponding files of a second file format.

One embodiment of mobile device 19 includes a network interface 145, processor 146, memory 147, camera 148, sensors 149, and display 150, all in communication with each other. Network interface 145 allows mobile device 19 to connect to one or more networks 180. Network interface 145 may include a wireless network interface, a modem, and/or a wired network interface. Processor 146 allows mobile device 19 to execute computer readable instructions stored in memory 147 in order to perform processes discussed herein. Camera 148 may capture color images and/or depth images. Sensors 149 may generate motion and/or orientation information associated with mobile device 19. In some cases, sensors 149 may comprise an inertial measurement unit (IMU). Display 150 may display digital images and/or videos. Display 150 may comprise a see-through display.

In some embodiments, various components of mobile device 19 including the network interface 145, processor 146, memory 147, camera 148, and sensors 149 may be integrated on a single chip substrate. In one example, the network interface 145, processor 146, memory 147, camera 148, and sensors 149 may be integrated as a system on a chip (SOC). In other embodiments, the network interface 145, processor 146, memory 147, camera 148, and sensors 149 may be integrated within a single package.

In some embodiments, mobile device 19 may provide a natural user interface (NUI) by employing camera 148, sensors 149, and gesture recognition software running on processor 146. With a natural user interface, a person's body parts and movements may be detected, interpreted, and used to control various aspects of a computing application. In one example, a computing device utilizing a natural user interface may infer the intent of a person interacting with the computing device (e.g., that the end user has performed a particular gesture in order to control the computing device).

Networked computing environment 100 may provide a cloud computing environment for one or more computing devices. Cloud computing refers to Internet-based computing, wherein shared resources, software, and/or information are provided to one or more computing devices on-demand via the Internet (or other global network). The term "cloud" is used as a metaphor for the Internet, based on the cloud drawings used in computer networking diagrams to depict the Internet as an abstraction of the underlying infrastructure it represents.

In one example, mobile device 19 comprises a head-mounted display device (HMD) that provides an augmented reality environment or a mixed reality environment to an end user of the HMD. The HMD may comprise a video see-through and/or an optical see-through system. An optical see-through HMD worn by an end user may allow actual direct viewing of a real-world environment (e.g., via transparent lenses) and may, at the same time, project images of a virtual object into the visual field of the end user thereby augmenting the real-world environment perceived by the end user with the virtual object.

Utilizing an HMD, an end user may move around a real-world environment (e.g., a living room) wearing the HMD and perceive views of the real-world overlaid with images of virtual objects. The virtual objects may appear to maintain coherent spatial relationship with the real-world environment (i.e., as the end user turns their head or moves within the real-world environment, the images displayed to the end user will change such that the virtual objects appear to exist within the real-world environment as perceived by the end user). The virtual objects may also appear fixed with respect to the end user's point of view (e.g., a virtual menu that always appears in the top right corner of the end user's point of view regardless of how the end user turns their head or moves within the real-world environment). In one embodiment, environmental mapping of the real-world environment may be performed by server 15 (i.e., on the server side) while camera localization may be performed on mobile device 19 (i.e., on the client side). The virtual objects may include a text description associated with a real-world object.

In some embodiments, a mobile device, such as mobile device 19, may be in communication with a server in the cloud, such as server 15, and may provide to the server location information (e.g., the location of the mobile device via GPS coordinates) and/or image information (e.g., information regarding objects detected within a field of view of the mobile device) associated with the mobile device. In response, the server may transmit to the mobile device one or more virtual objects based upon the location information and/or image information provided to the server. In one embodiment, the mobile device 19 may specify a particular file format for receiving the one or more virtual objects and server 15 may transmit to the mobile device 19 the one or more virtual objects embodied within a file of the particular file format.

In some embodiments, a mobile device, such as mobile device 19, may identify and amplify sounds originating from a first person corresponding with a high priority level, while attenuating other sounds originating from other sources of sound corresponding with priority levels lower than the high priority level associated with the first person (e.g., background noise or voices from other people within an environment). The first person may be associated a user profile specifying the high priority level. The first person may be assigned the high priority level based on a gesture performed by an end user of the mobile device (e.g., the end user pointing at or towards the first person). In some embodiments, the mobile device may attenuate sounds originating from a second person corresponding with a low priority level, while maintaining sound levels associated with other sounds originating from other sources of sound within an environment. Amplification of a particular sound may correspond with an increase in a sound level (or increase in sound volume) of the particular sound. Attenuation of a particular sound may correspond with a decrease in a sound level (or decrease in sound volume) of the particular sound.

Figure 2A:
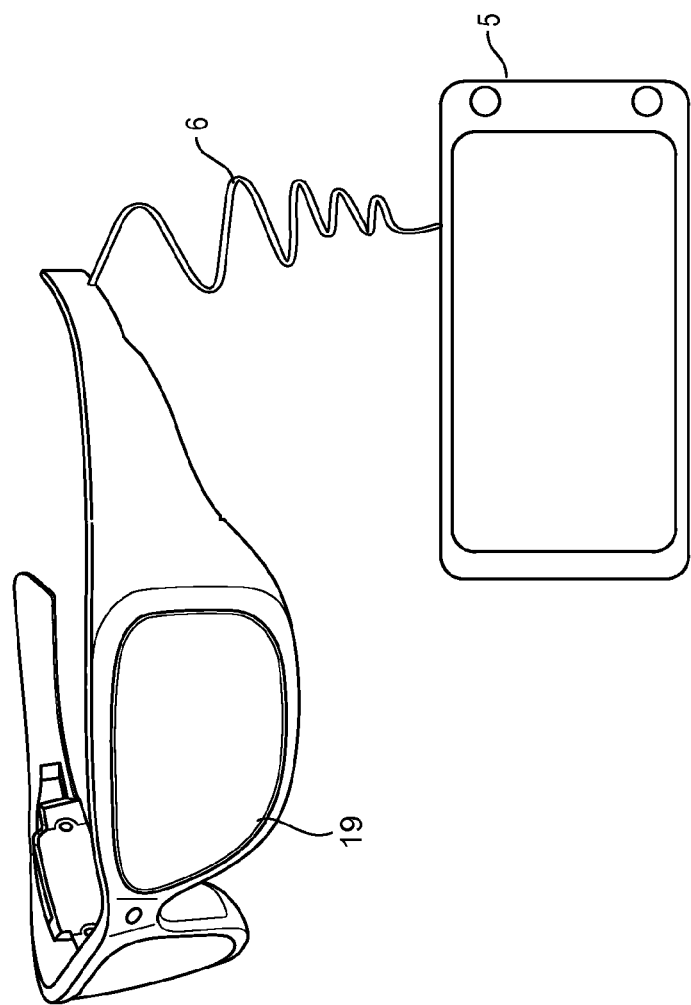
FIG. 2A depicts one embodiment of a mobile device in communication with a second mobile device.

FIG. 2A depicts one embodiment of a mobile device 19 in communication with a second mobile device 5. Mobile device 19 may comprise a see-through HMD. As depicted, mobile device 19 communicates with mobile device 5 via a wired connection 6. However, the mobile device 19 may also communicate with mobile device 5 via a wireless connection. Mobile device 5 may be used by mobile device 19 in order to offload compute intensive processing tasks (e.g., the rendering of virtual objects) and to store virtual object information and other data that may be used to provide an augmented reality environment on mobile device 19.

Figure 2B:
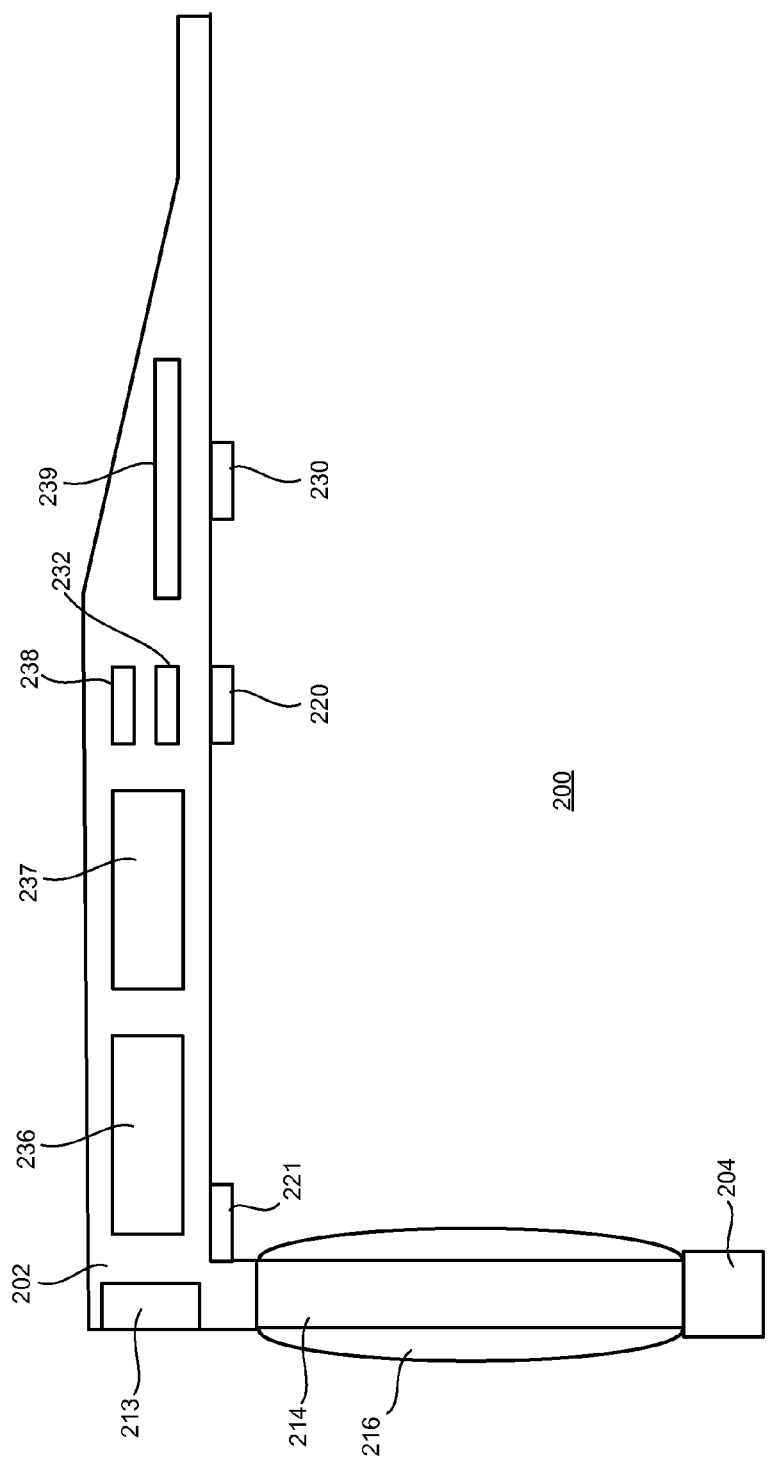
FIG. 2B depicts one embodiment of a portion of an HMD.

FIG. 2B depicts one embodiment of a portion of an HMD, such as mobile device 19 in FIG. 1. Only the right side of an HMD 200 is depicted. HMD 200 includes right temple 202, nose bridge 204, eye glass 216, and eye glass frame 214. Right temple 202 includes a capture device 213 (e.g., a front facing camera and/or microphone) in communication with processing unit 236. The capture device 213 may include one or more cameras for recording digital images and/or videos and may transmit the visual recordings to processing unit 236. The one or more cameras may capture color information, IR information, and/or depth information. The capture device 213 may also include one or more microphones for recording sounds and may transmit the audio recordings to processing unit 236.

Right temple 202 also includes biometric sensor 220, eye tracking system 221, earphones 230, motion and orientation sensor 238, GPS receiver 232, power supply 239, and wireless interface 237, all in communication with processing unit 236. Biometric sensor 220 may include one or more electrodes for determining a pulse or heart rate associated with an end user of HMD 200 and a temperature sensor for determining a body temperature associated with the end user of HMD 200. In one embodiment, biometric sensor 220 includes a pulse rate measuring sensor which presses against the temple of the end user. Motion and orientation sensor 238 may include a three axis magnetometer, a three axis gyro, and/or a three axis accelerometer. In one embodiment, the motion and orientation sensor 238 may comprise an inertial measurement unit (IMU). The GPS receiver may determine a GPS location associated with HMD 200. Processing unit 236 may include one or more processors and a memory for storing computer readable instructions to be executed on the one or more processors. The memory may also store other types of data to be executed on the one or more processors.

In one embodiment, the eye tracking system 221 may include an inward facing camera. In another embodiment, the eye tracking system 221 may comprise an eye tracking illumination source and an associated eye tracking IR sensor. In one embodiment, the eye tracking illumination source may include one or more infrared (IR) emitters such as an infrared light emitting diode (LED) or a laser (e.g. VCSEL) emitting about a predetermined IR wavelength or a range of wavelengths. In some embodiments, the eye tracking sensor may include an IR camera or an IR position sensitive detector (PSD) for tracking glint positions. More information about eye tracking systems can be found in U.S. Pat. No. 7,401,920, entitled "Head Mounted Eye Tracking and Display System", issued Jul. 22, 2008, and U.S. patent application Ser. No. 13/245,700, entitled "Integrated Eye Tracking and Display System," filed Sep. 26, 2011, both of which are herein incorporated by reference.

In one embodiment, eye glass 216 may comprise a see-through display, whereby images generated by processing unit 236 may be projected and/or displayed on the see-through display. The capture device 213 may be calibrated such that a field of view captured by the capture device 213 corresponds with the field of view as seen by an end user of HMD 200. The earphones 230 may be used to output sounds associated with the projected images of virtual objects. The earphones 230 may comprise stereo earphones or mono earphones. The earphones 230 may comprise earbuds or in-ear headphones. Earbuds may comprise earphones that sit in the outer ears of an end user and allow some ambient sounds to filter in to the end user's ear canal. In-ear headphones may extend more deeply into the end user's ear canal and provide greater isolation from ambient sounds.

In some embodiments, HMD 200 may include two or more front facing cameras (e.g., one on each temple) in order to obtain depth from stereo information associated with the field of view captured by the front facing cameras. The two or more front facing cameras may also comprise 3D, IR, and/or RGB cameras. Depth information may also be acquired from a single camera utilizing depth from motion techniques. For example, two images may be acquired from the single camera associated with two different points in space at different points in time. Parallax calculations may then be performed given position information regarding the two different points in space.

In some embodiments, HMD 200 may perform gaze detection for each eye of an end user's eyes using gaze detection elements and a three-dimensional coordinate system in relation to one or more human eye elements such as a cornea center, a center of eyeball rotation, or a pupil center. Gaze detection may be used to identify where the end user is focusing within a field of view. Examples of gaze detection elements may include glint generating illuminators and sensors for capturing data representing the generated glints. In some cases, the center of the cornea can be determined based on two glints using planar geometry. The center of the cornea links the pupil center and the center of rotation of the eyeball, which may be treated as a fixed location for determining an optical axis of the end user's eye at a certain gaze or viewing angle.

Figure 2C:
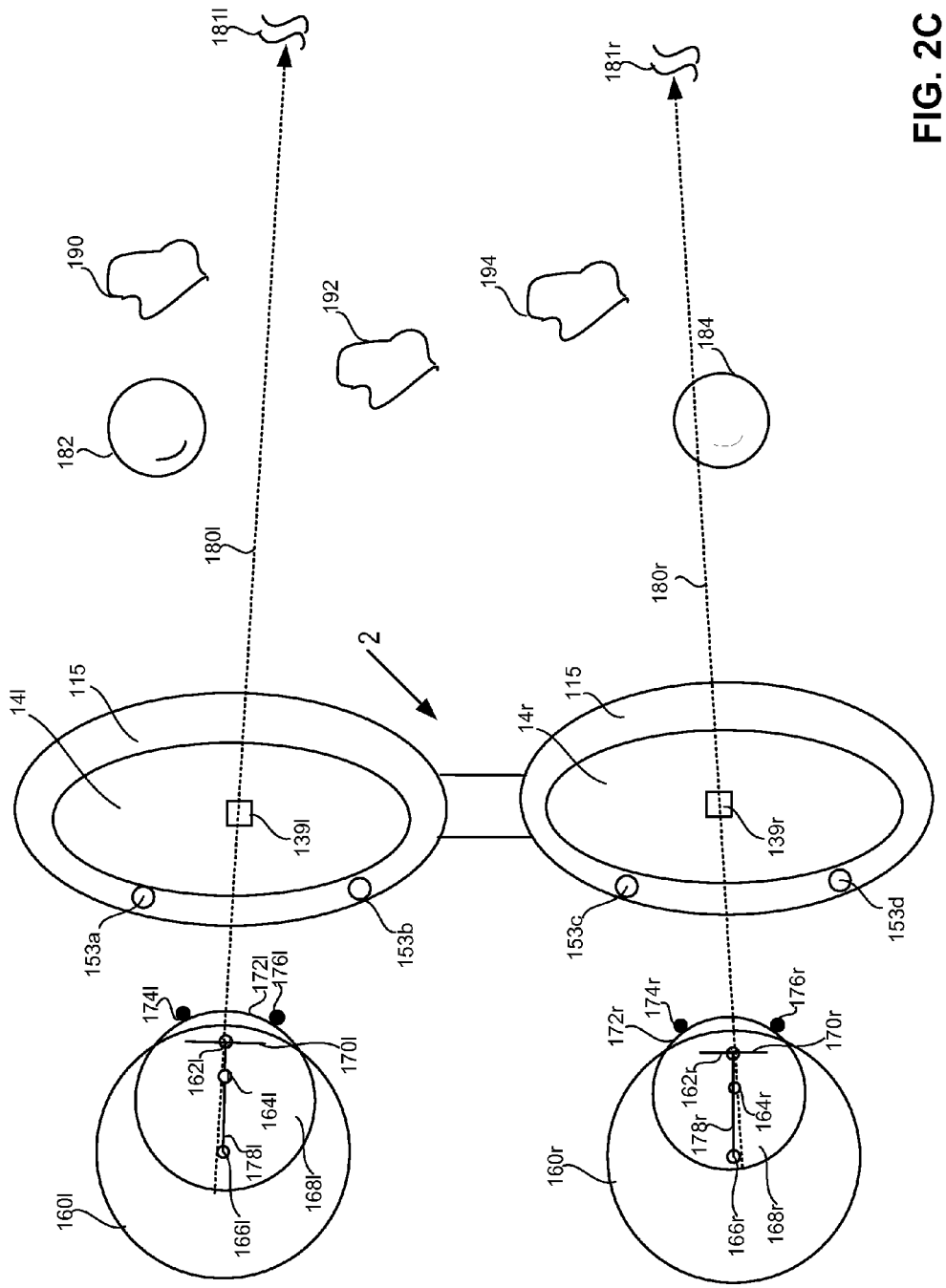
FIG. 2C depicts one embodiment of a portion of an HMD in which gaze vectors extending to a point of gaze are used for aligning a far inter-pupillary distance (IPD).

FIG. 2C depicts one embodiment of a portion of an HMD 2 in which gaze vectors extending to a point of gaze are used for aligning a far inter-pupillary distance (IPD). HMD 2 is one example of a mobile device, such as mobile device 19 in FIG. 1. As depicted, gaze vectors 180l and 180r intersect at a point of gaze that is far away from the end user (i.e., the gaze vectors 180l and 180r do not intersect as the end user is looking at an object far away). A model of the eyeball for eyeballs 160l and 160r is illustrated for each eye based on the Gullstrand schematic eye model. Each eyeball is modeled as a sphere with a center of rotation 166 and includes a cornea 168 modeled as a sphere having a center 164. The cornea 168 rotates with the eyeball, and the center of rotation 166 of the eyeball may be treated as a fixed point. The cornea 168 covers an iris 170 with a pupil 162 at its center. On the surface 172 of each cornea are glints 174 and 176.

As depicted in FIG. 2C, a sensor detection area 139 (i.e., 139l and 139r, respectively) is aligned with the optical axis of each display optical system 14 within an eyeglass frame 115. In one example, the sensor associated with the detection area may include one or more cameras capable of capturing image data representing glints 174l and 176l generated respectively by illuminators 153a and 153b on the left side of the frame 115 and data representing glints 174r and 176r generated respectively by illuminators 153c and 153d on the right side of the frame 115. Through the display optical systems 14l and 14r in the eyeglass frame 115, the end user's field of view includes both real objects 190, 192, and 194 and virtual objects 182 and 184.

The axis 178 formed from the center of rotation 166 through the cornea center 164 to the pupil 162 comprises the optical axis of the eye. A gaze vector 180 may also be referred to as the line of sight or visual axis which extends from the fovea through the center of the pupil 162. In some embodiments, the optical axis is determined and a small correction is determined through user calibration to obtain the visual axis which is selected as the gaze vector. For each end user, a virtual object may be displayed by the display device at each of a number of predetermined positions at different horizontal and vertical positions. An optical axis may be computed for each eye during display of the object at each position, and a ray modeled as extending from the position into the user's eye. A gaze offset angle with horizontal and vertical components may be determined based on how the optical axis must be moved to align with the modeled ray. From the different positions, an average gaze offset angle with horizontal or vertical components can be selected as the small correction to be applied to each computed optical axis. In some embodiments, only a horizontal component is used for the gaze offset angle correction.

As depicted in FIG. 2C, the gaze vectors 180*l* and 180*r* are not perfectly parallel as the vectors become closer together as they extend from the eyeball into the field of view at a point of gaze. At each display optical system 14, the gaze vector 180 appears to intersect the optical axis upon which the sensor detection area 139 is centered. In this configuration, the optical axes are aligned with the inter-pupillary distance (IPD). When an end user is looking straight ahead, the IPD measured is also referred to as the far IPD.

Figure 2D:
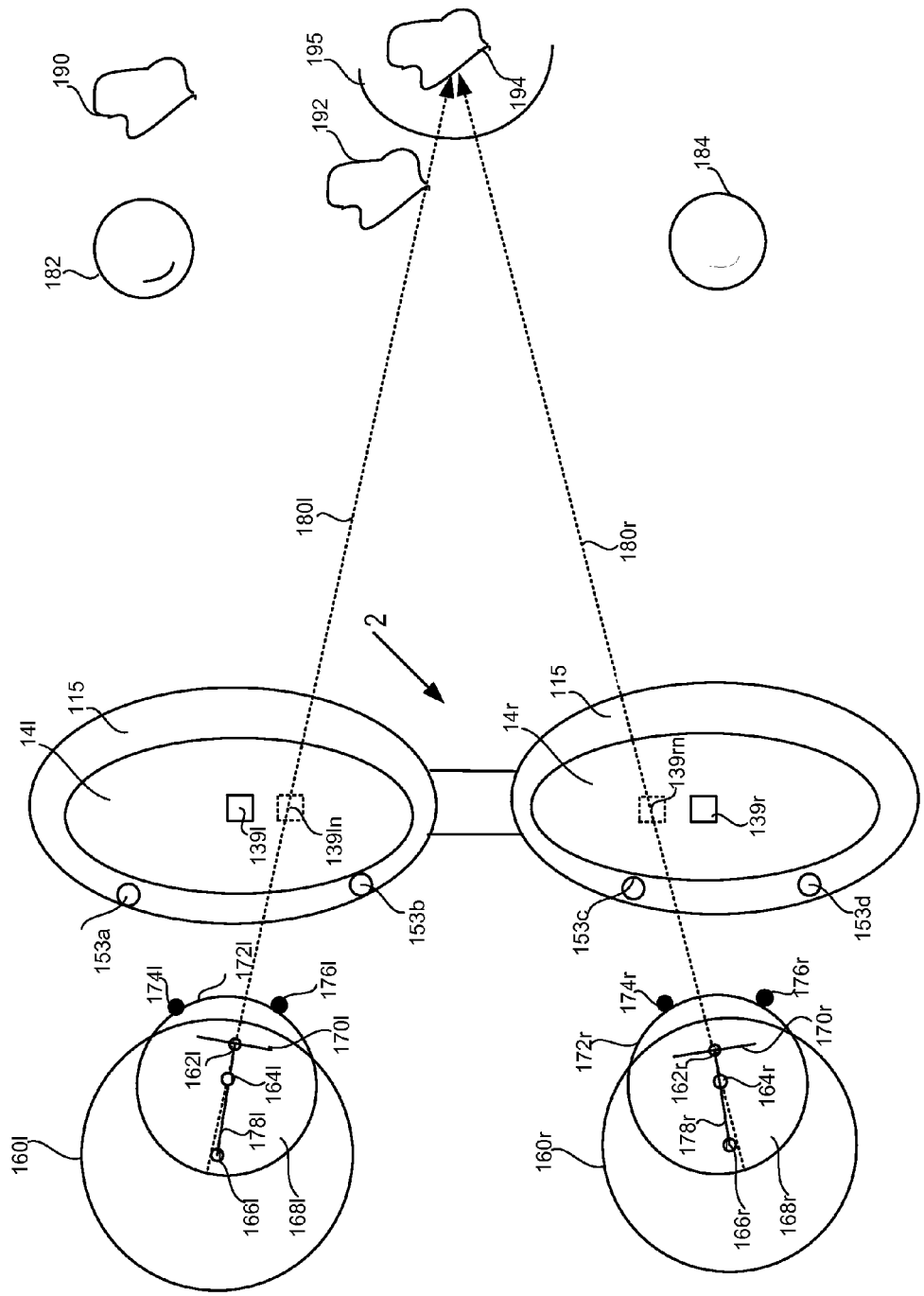
FIG. 2D depicts one embodiment of a portion of an HMD in which gaze vectors extending to a point of gaze are used for aligning a near inter-pupillary distance (IPD).

FIG. 2D depicts one embodiment of a portion of an HMD 2 in which gaze vectors extending to a point of gaze are used for aligning a near inter-pupillary distance (IPD). HMD 2 is one example of a mobile device, such as mobile device 19 in FIG. 1. As depicted, the cornea 168*l* of the left eye is rotated to the right or towards the end user's nose, and the cornea 168*r* of the right eye is rotated to the left or towards the end user's nose. Both pupils are gazing at a real object 194 within a particular distance of the end user. Gaze vectors 180*l* and 180*r* from each eye enter the Panum's fusional region 195 in which real object 194 is located. The Panum's fusional region is the area of single vision in a binocular viewing system like that of human vision. The intersection of the gaze vectors 180*l* and 180*r* indicates that the end user is looking at real object 194. At such a distance, as the eyeballs rotate inward, the distance between their pupils decreases to a near IPD. The near IPD is typically about 4 mm less than the far IPD. A near IPD distance criteria (e.g., a point of gaze at less than four feet from the end user) may be used to switch or adjust the IPD alignment of the display optical systems 14 to that of the near IPD. For the near IPD, each display optical system 14 may be moved toward the end user's nose so the optical axis, and detection area 139, moves toward the nose a few millimeters as represented by detection areas 139*ln* and 139*rn*.

More information about determining the IPD for an end user of an HMD and adjusting the display optical systems accordingly can be found in U.S. patent application Ser. No. 13/250,878, entitled "Personal Audio/Visual System," filed Sep. 30, 2011, which is herein incorporated by reference in its entirety.

Figure 2E:
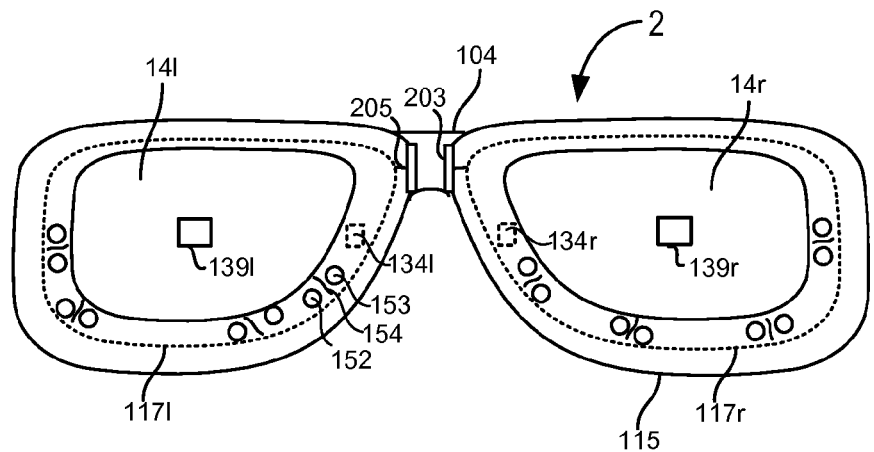
FIG. 2E depicts one embodiment of a portion of an HMD with movable display optical systems including gaze detection elements.

FIG. 2E depicts one embodiment of a portion of an HMD 2 with movable display optical systems including gaze detection elements. What appears as a lens for each eye represents a display optical system 14 for each eye (i.e., 14*l* and 14*r*). A display optical system includes a see-through lens and optical elements (e.g. mirrors, filters) for seamlessly fusing virtual content with the actual direct real world view seen through the lenses of the HMD. A display optical system 14 has an optical axis which is generally in the center of the see-through lens in which light is generally collimated to provide a distortionless view. For example, when an eye care professional fits an ordinary pair of eyeglasses to an end user's face, the glasses are usually fit such that they sit on the end user's nose at a position where each pupil is aligned with the center or optical axis of the respective lens resulting in generally collimated light reaching the end user's eye for a clear or distortionless view.

As depicted in FIG. 2E, a detection area 139*r*, 139*l* of at least one sensor is aligned with the optical axis of its respective display optical system 14*r*, 14*l* so that the center of the detection area 139*r*, 139*l* is capturing light along the optical axis. If the display optical system 14 is aligned with the end user's pupil, then each detection area 139 of the respective sensor 134 is aligned with the end user's pupil. Reflected light of the detection area 139 is transferred via one or more optical elements to the actual image sensor 134 of the camera, which in the embodiment depicted is illustrated by the dashed line as being inside the frame 115.

In one embodiment, the at least one sensor 134 may be a visible light camera (e.g., an RGB camera). In one example, an optical element or light directing element comprises a visible light reflecting mirror which is partially transmissive and partially reflective. The visible light camera provides image data of the pupil of the end user's eye, while IR photodetectors 152 capture glints which are reflections in the IR portion of the spectrum. If a visible light camera is used, reflections of virtual images may appear in the eye data captured by the camera. An image filtering technique may be used to remove the virtual image reflections if desired. An IR camera is not sensitive to the virtual image reflections on the eye.

In another embodiment, the at least one sensor 134 (i.e., 134*l* and 134*r*) is an IR camera or a position sensitive detector (PSD) to which the IR radiation may be directed. The IR radiation reflected from the eye may be from incident radiation of the illuminators 153, other IR illuminators (not shown), or from ambient IR radiation reflected off the eye. In some cases, sensor 134 may be a combination of an RGB and an IR camera, and the light directing elements may include a visible light reflecting or diverting element and an IR radiation reflecting or diverting element. In some cases, the sensor 134 may be embedded within a lens of the system 14. Additionally, an image filtering technique may be applied to blend the camera into a user field of view to lessen any distraction to the user.

As depicted in FIG. 2E, there are four sets of an illuminator 153 paired with a photodetector 152 and separated by a barrier 154 to avoid interference between the incident light generated by the illuminator 153 and the reflected light received at the photodetector 152. To avoid unnecessary clutter in the drawings, drawing numerals are shown with respect to a representative pair. Each illuminator may be an infra-red (IR) illuminator which generates a narrow beam of light at about a predetermined wavelength. Each of the photodetectors may be selected to capture light at about the predetermined wavelength. Infra-red may also include near-infrared. As there can be wavelength drift of an illuminator or photodetector or a small range about a wavelength may be acceptable, the illuminator and photodetector may have a tolerance range about a wavelength for generation and detection. In some embodiments where the sensor is an IR camera or IR position sensitive detector (PSD), the photodetectors may include additional data capture devices and may also be used to monitor the operation of the illuminators, e.g. wavelength drift, beam width changes, etc. The photodetectors may also provide glint data with a visible light camera as the sensor 134.

As depicted in FIG. 2E, each display optical system 14 and its arrangement of gaze detection elements facing each eye (e.g., such as camera 134 and its detection area 139, the illuminators 153, and photodetectors 152) are located on a movable inner frame portion 117*l*, 117*r*. In this example, a display adjustment mechanism comprises one or more motors 203 having a shaft 205 which attaches to the inner frame portion 117 which slides from left to right or vice versa within the frame 115 under the guidance and power of shafts 205 driven by motors 203. In some embodiments, one motor 203 may drive both inner frames.

Figure 2F:
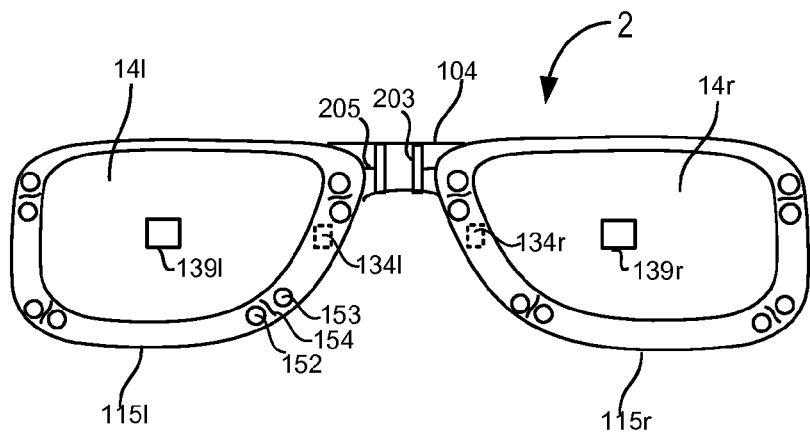
FIG. 2F depicts an alternative embodiment of a portion of an HMD with movable display optical systems including gaze detection elements.

FIG. 2F depicts an alternative embodiment of a portion of an HMD 2 with movable display optical systems including gaze detection elements. As depicted, each display optical system 14 is enclosed in a separate frame portion 115*l*, 115*r*. Each of the frame portions may be moved separately by the motors 203. More information about HMDs with movable display optical systems can be found in U.S. patent application Ser. No. 13/250,878, entitled "Personal Audio/Visual System," filed Sep. 30, 2011, which is herein incorporated by reference in its entirety.

FIG. 2G depicts one embodiment of a side view of a portion of an HMD 2 including an eyeglass temple 102 of the frame 115. At the front of frame 115 is a front facing video camera 113 that can capture video and still images. In some embodiments, front facing camera 113 may include a depth camera as well as a visible light or RGB camera. In one example, the depth camera may include an IR illuminator transmitter and a hot reflecting surface like a hot mirror in front of the visible image sensor which lets the visible light pass and directs reflected IR radiation within a wavelength range or about a predetermined wavelength transmitted by the illuminator to a CCD or other type of depth sensor. Other types of visible light cameras (e.g., an RGB camera or image sensor) and depth cameras can be used. The data from the cameras may be sent to control circuitry 136 for processing in order to identify objects through image segmentation and/or edge detection techniques.

Inside temple 102, or mounted to temple 102, are earphones 130, inertial sensors 132, GPS transceiver 144, and temperature sensor 138. In one embodiment, inertial sensors 132 include a three axis magnetometer, three axis gyro, and three axis accelerometer. The inertial sensors are for sensing position, orientation, and sudden accelerations of HMD 2. From these movements, head position may also be determined.

In some cases, HMD 2 may include an image generation unit which can create one or more images including one or more virtual objects. In some embodiments, a microdisplay may be used as the image generation unit. As depicted, microdisplay assembly 173 comprises light processing elements and a variable focus adjuster 135. An example of a light processing element is a microdisplay unit 120. Other examples include one or more optical elements such as one or more lenses of a lens system 122 and one or more reflecting elements such as surfaces 124. Lens system 122 may comprise a single lens or a plurality of lenses.

Mounted to or inside temple 102, the microdisplay unit 120 includes an image source and generates an image of a virtual object. The microdisplay unit 120 is optically aligned with the lens system 122 and the reflecting surface 124. The optical alignment may be along an optical axis 133 or an optical path 133 including one or more optical axes. The microdisplay unit 120 projects the image of the virtual object through lens system 122, which may direct the image light onto reflecting element 124. The variable focus adjuster 135 changes the displacement between one or more light processing elements in the optical path of the microdisplay assembly or an optical power of an element in the microdisplay assembly. The optical power of a lens is defined as the reciprocal of its focal length (i.e., 1/focal length) so a change in one effects the other. The change in focal length results in a change in the region of the field of view which is in focus for an image generated by the microdisplay assembly 173.

In one example of the microdisplay assembly 173 making displacement changes, the displacement changes are guided within an armature 137 supporting at least one light processing element such as the lens system 122 and the microdisplay 120. The armature 137 helps stabilize the alignment along the optical path 133 during physical movement of the elements to achieve a selected displacement or optical power. In some examples, the adjuster 135 may move one or more optical elements such as a lens in lens system 122 within the armature 137. In other examples, the armature may have grooves or space in the area around a light processing element so it slides over the element, for example, microdisplay 120, without moving the light processing element. Another element in the armature such as the lens system 122 is attached so that the system 122 or a lens within slides or moves with the moving armature 137. The displacement range is typically on the order of a few millimeters (mm). In one example, the range is 1-2 mm. In other examples, the armature 137 may provide support to the lens system 122 for focal adjustment techniques involving adjustment of other physical parameters than displacement. An example of such a parameter is polarization.

More information about adjusting a focal distance of a microdisplay assembly can be found in U.S. patent Ser. No. 12/941,825 entitled "Automatic Variable Virtual Focus for Augmented Reality Displays," filed Nov. 8, 2010, which is herein incorporated by reference in its entirety.

In one embodiment, the adjuster 135 may be an actuator such as a piezoelectric motor. Other technologies for the actuator may also be used and some examples of such technologies are a voice coil formed of a coil and a permanent magnet, a magnetostriction element, and an electrostriction element.

Several different image generation technologies may be used to implement microdisplay 120. In one example, microdisplay 120 can be implemented using a transmissive projection technology where the light source is modulated by optically active material and backlit with white light. These technologies are usually implemented using LCD type displays with powerful backlights and high optical energy densities. Microdisplay 120 can also be implemented using a reflective technology for which external light is reflected and modulated by an optically active material. The illumination may be forward lit by either a white source or RGB source, depending on the technology. Digital light processing (DLP), liquid crystal on silicon (LCOS) and Mirasol® display technology from Qualcomm, Inc. are all examples of reflective technologies which are efficient as most energy is reflected away from the modulated structure and may be used in the system described herein. Additionally, microdisplay 120 can be implemented using an emissive technology where light is generated by the display. For example, a PicoP™ engine from Microvision, Inc. emits a laser signal with a micro mirror steering either onto a tiny screen that acts as a transmissive element or beamed directly into the eye (e.g., laser).

FIG. 2H depicts one embodiment of a side view of a portion of an HMD 2 which provides support for a three dimensional adjustment of a microdisplay assembly. Some of the numerals illustrated in the FIG. 2G above have been removed to avoid clutter in the drawing. In some embodiments where the display optical system 14 is moved in any of three dimensions, the optical elements represented by reflecting surface 124 and the other elements of the microdisplay assembly 173 may also be moved for maintaining the optical path 133 of the light of a virtual image to the display optical system. An XYZ transport mechanism in this example made up of one or more motors represented by motor block 203 and shafts 205 under control of control circuitry 136 control movement of the elements of the microdisplay assembly 173. An example of motors which may be used are piezoelectric motors. In the illustrated example, one motor is attached to the armature 137 and moves the variable focus adjuster 135 as well, and another representative motor 203 controls the movement of the reflecting element 124.

Figure 3:
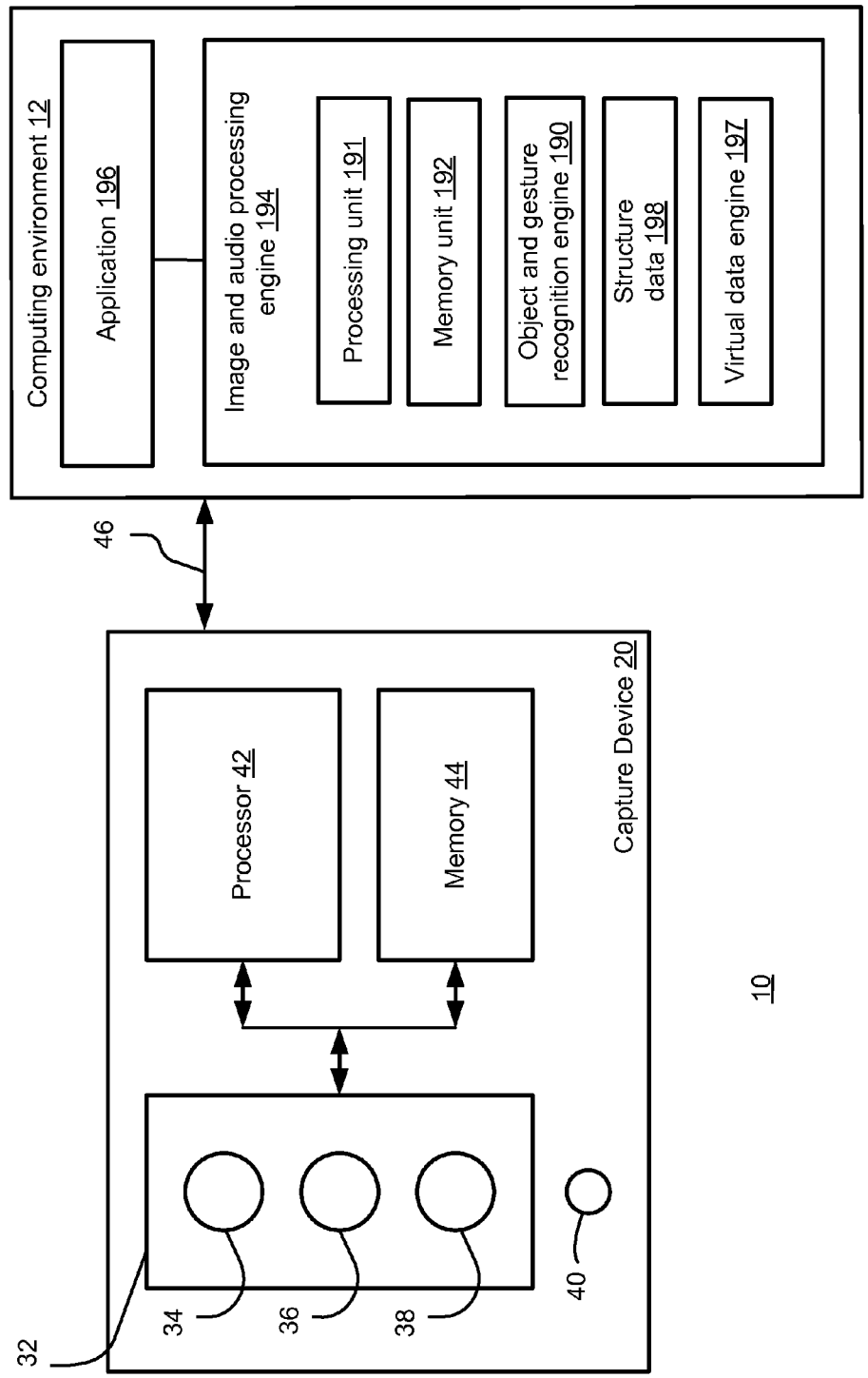
FIG. 3 depicts one embodiment of a computing system including a capture device and computing environment.

FIG. 3 depicts one embodiment of a computing system 10 including a capture device 20 and computing environment 12. In some embodiments, capture device 20 and computing environment 12 may be integrated within a single mobile computing device. The single integrated mobile computing device may comprise a mobile device, such as mobile device 19 in FIG. 1. In one example, the capture device 20 and computing environment 12 may be integrated within an HMD. In other embodiments, capture device 20 may be integrated with a first mobile device, such as mobile device 19 in FIG. 2A, and computing environment 12 may be integrated with a second mobile device in communication with the first mobile device, such as mobile device 5 in FIG. 2A.

In one embodiment, the capture device 20 may include one or more image sensors for capturing images and videos. An image sensor may comprise a CCD image sensor or a CMOS image sensor. In some embodiments, capture device 20 may include an IR CMOS image sensor. The capture device 20 may also include a depth sensor (or depth sensing camera) configured to capture video with depth information including a depth image that may include depth values via any suitable technique including, for example, time-of-flight, structured light, stereo image, or the like.

The capture device 20 may include an image camera component 32. In one embodiment, the image camera component 32 may include a depth camera that may capture a depth image of a scene. The depth image may include a two-dimensional (2D) pixel area of the captured scene where each pixel in the 2D pixel area may represent a depth value such as a distance in, for example, centimeters, millimeters, or the like of an object in the captured scene from the image camera component 32.

The image camera component 32 may include an IR light component 34, a three-dimensional (3D) camera 36, and an RGB camera 38 that may be used to capture the depth image of a capture area. For example, in time-of-flight analysis, the IR light component 34 of the capture device 20 may emit an infrared light onto the capture area and may then use sensors to detect the backscattered light from the surface of one or more objects in the capture area using, for example, the 3D camera 36 and/or the RGB camera 38. In some embodiments, pulsed infrared light may be used such that the time between an outgoing light pulse and a corresponding incoming light pulse may be measured and used to determine a physical distance from the capture device 20 to a particular location on the one or more objects in the capture area. Additionally, the phase of the outgoing light wave may be compared to the phase of the incoming light wave to determine a phase shift. The phase shift may then be used to determine a physical distance from the capture device to a particular location associated with the one or more objects.

In another example, the capture device 20 may use structured light to capture depth information. In such an analysis, patterned light (i.e., light displayed as a known pattern such as grid pattern or a stripe pattern) may be projected onto the capture area via, for example, the IR light component 34. Upon striking the surface of one or more objects (or targets) in the capture area, the pattern may become deformed in response. Such a deformation of the pattern may be captured by, for example, the 3-D camera 36 and/or the RGB camera 38 and analyzed to determine a physical distance from the capture device to a particular location on the one or more objects. Capture device 20 may include optics for producing collimated light. In some embodiments, a laser projector may be used to create a structured light pattern. The light projector may include a laser, laser diode, and/or LED.

In some embodiments, two or more different cameras may be incorporated into an integrated capture device. For example, a depth camera and a video camera (e.g., an RGB video camera) may be incorporated into a common capture device. In some embodiments, two or more separate capture devices of the same or differing types may be cooperatively used. For example, a depth camera and a separate video camera may be used, two video cameras may be used, two depth cameras may be used, two RGB cameras may be used, or any combination and number of cameras may be used. In one embodiment, the capture device 20 may include two or more physically separated cameras that may view a capture area from different angles to obtain visual stereo data that may be resolved to generate depth information. Depth may also be determined by capturing images using a plurality of detectors that may be monochromatic, infrared, RGB, or any other type of detector and performing a parallax calculation. Other types of depth image sensors can also be used to create a depth image.

As depicted in FIG. 3, capture device 20 may include one or more microphones 40. Each of the one or more microphones 40 may include a transducer or sensor that may receive and convert sound into an electrical signal. The one or more microphones may comprise a microphone array in which the one or more microphones may be arranged in a predetermined layout.

The capture device 20 may include a processor 42 that may be in operative communication with the image camera component 32. The processor 42 may include a standardized processor, a specialized processor, a microprocessor, or the like. The processor 42 may execute instructions that may include instructions for storing filters or profiles, receiving and analyzing images, determining whether a particular situation has occurred, or any other suitable instructions. It is to be understood that at least some image analysis and/or target analysis and tracking operations may be executed by processors contained within one or more capture devices such as capture device 20.

The capture device 20 may include a memory 44 that may store the instructions that may be executed by the processor 42, images or frames of images captured by the 3D camera or RGB camera, filters or profiles, or any other suitable information, images, or the like. In one example, the memory 44 may include random access memory (RAM), read only memory (ROM), cache, Flash memory, a hard disk, or any other suitable storage component. As depicted, the memory 44 may be a separate component in communication with the image capture component 32 and the processor 42. In another embodiment, the memory 44 may be integrated into the processor 42 and/or the image capture component 32. In other embodiments, some or all of the components 32, 34, 36, 38, 40, 42 and 44 of the capture device 20 may be housed in a single housing.

The capture device 20 may be in communication with the computing environment 12 via a communication link 46. The communication link 46 may be a wired connection including, for example, a USB connection, a FireWire connection, an Ethernet cable connection, or the like and/or a wireless connection such as a wireless 802.11b, g, a, or n connection. The computing environment 12 may provide a clock to the capture device 20 that may be used to determine when to capture, for example, a scene via the communication link 46. In one embodiment, the capture device 20 may provide the images captured by, for example, the 3D camera 36 and/or the RGB camera 38 to the computing environment 12 via the communication link 46.

As depicted in FIG. 3, computing environment 12 includes image and audio processing engine 194 in communication with application 196. Application 196 may comprise an operating system application or other computing application such as a gaming application. Image and audio processing engine 194 includes virtual data engine 197, object and gesture recognition engine 190, structure data 198, processing unit 191, and memory unit 192, all in communication with each other. Image and audio processing engine 194 processes video, image, and audio data received from capture device 20. To assist in the detection and/or tracking of objects, image and audio processing engine 194 may utilize structure data 198 and object and gesture recognition engine 190. Virtual data engine 197 processes virtual objects and registers the position and orientation of virtual objects in relation to various maps of a real-world environment stored in memory unit 192.

Processing unit 191 may include one or more processors for executing object, facial, and voice recognition algorithms. In one embodiment, image and audio processing engine 194 may apply object recognition and facial recognition techniques to image or video data. For example, object recognition may be used to detect particular objects (e.g., soccer balls, cars, people, or landmarks) and facial recognition may be used to detect the face of a particular person. Image and audio processing engine 194 may apply audio and voice recognition techniques to audio data. For example, audio recognition may be used to detect a particular sound. The particular faces, voices, sounds, and objects to be detected may be stored in one or more memories contained in memory unit 192. Processing unit 191 may execute computer readable instructions stored in memory unit 192 in order to perform processes discussed herein.

The image and audio processing engine 194 may utilize structural data 198 while performing object recognition. Structure data 198 may include structural information about targets and/or objects to be tracked. For example, a skeletal model of a human may be stored to help recognize body parts. In another example, structure data 198 may include structural information regarding one or more inanimate objects in order to help recognize the one or more inanimate objects.

The image and audio processing engine 194 may also utilize object and gesture recognition engine 190 while performing gesture recognition. In one example, object and gesture recognition engine 190 may include a collection of gesture filters, each comprising information concerning a gesture that may be performed by a skeletal model. The object and gesture recognition engine 190 may compare the data captured by capture device 20 in the form of the skeletal model and movements associated with it to the gesture filters in a gesture library to identify when a user (as represented by the skeletal model) has performed one or more gestures. In one example, image and audio processing engine 194 may use the object and gesture recognition engine 190 to help interpret movements of a skeletal model and to detect the performance of a particular gesture.

In some embodiments, one or more objects being tracked may be augmented with one or more markers such as an IR retroreflective marker to improve object detection and/or tracking. Planar reference images, coded AR markers, QR codes, and/or bar codes may also be used to improve object detection and/or tracking. Upon detection of one or more objects and/or gestures, image and audio processing engine 194 may report to application 196 an identification of each object or gesture detected and a corresponding position and/or orientation if applicable. More information about object and gesture recognition engine 190 can be found in U.S. Pat. No. 7,996,793, "Gesture Recognizer System Architecture," issued Aug. 9, 2011 filed on Apr. 13, 2009, incorporated herein by reference in its entirety.

Figure 4:
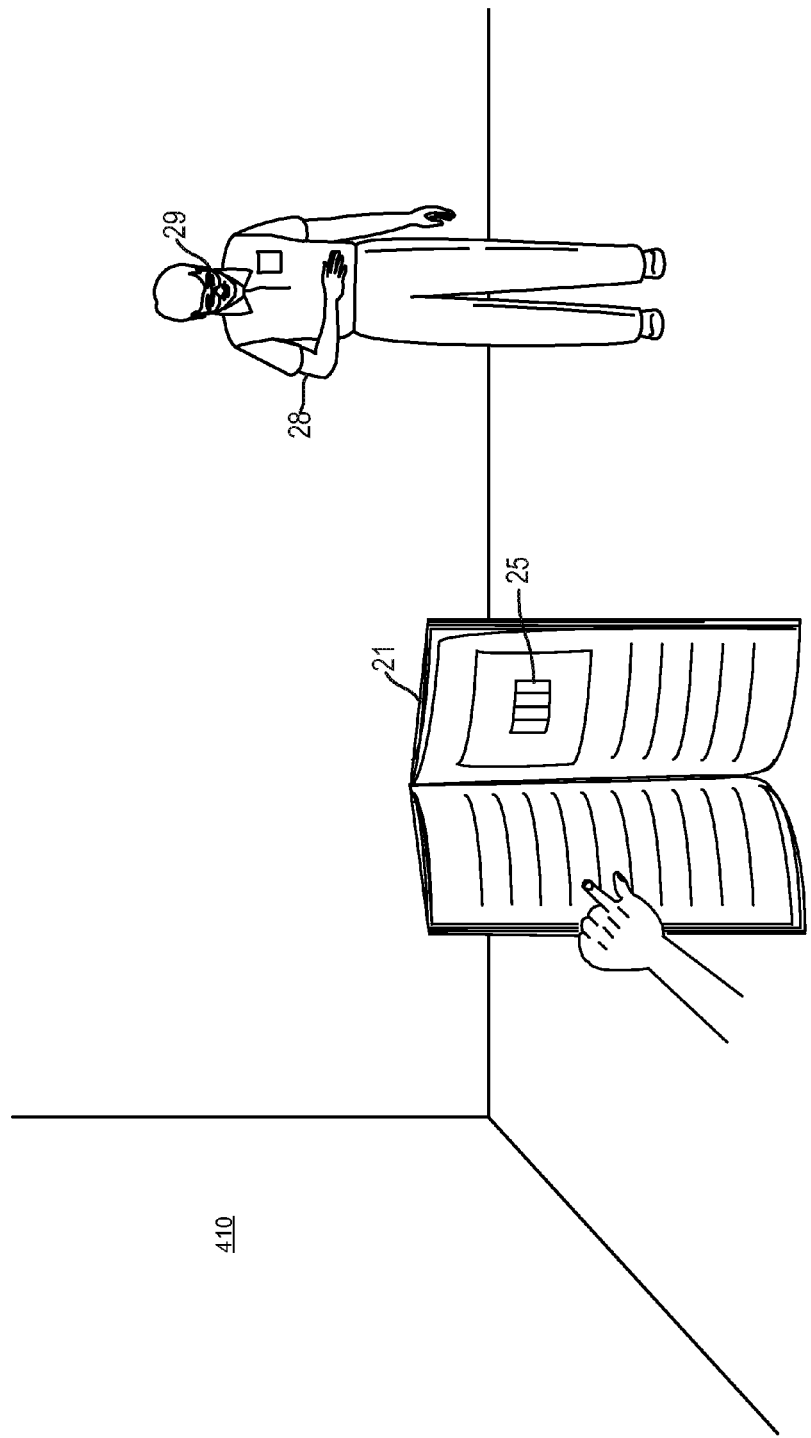
FIG. 4 depicts one embodiment of an augmented reality environment as seen by an end user wearing an HMD.

FIG. 4 depicts one embodiment of an augmented reality environment 410 as seen by an end user 28 wearing an HMD 29, such as mobile device 19 in FIG. 1. As depicted, the augmented reality environment 410 includes an augmentable reading object 21 including an AR tag 25. The augmentable reading object may comprise a book, magazine, or piece of literature. The AR tag 25 may comprise an image or graphic that may be used to determine one or more virtual sounds or audio recordings associated with the AR tag 25. The end user 28 associated with HMD 29 may listen to the one or more virtual sounds using earphones (or other audio output devices) associated with HMD 29 as a different person reads a story from the augmentable reading object 21. In one embodiment, the HMD 29 may play the audio recording (e.g., background music or a particular song) associated with AR tag 25 and adjust a sound level (or sound volume) associated with the audio recording whenever the HMD 29 detects that the different person is reading the story. In one example, the HMD 29 may attenuate sounds associated with the audio recording (e.g., by reducing a sound level associated with the audio recording) only when the different person is reading the story.

Figure 5A:
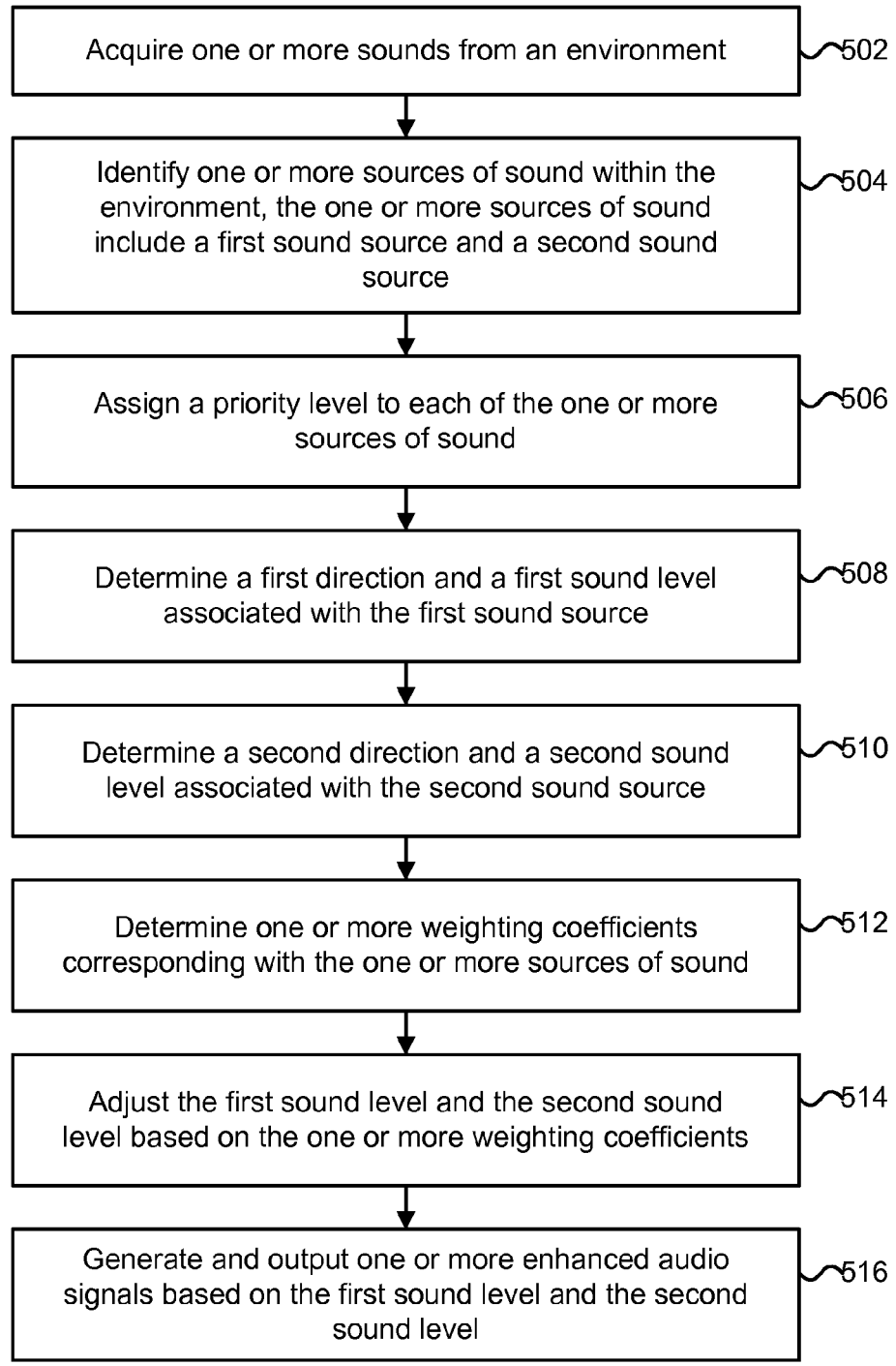
FIG. 5A is a flowchart describing one embodiment of a method for generating and outputting one or more enhanced audio signals.

FIG. 5A is a flowchart describing one embodiment of a method for generating and outputting one or more enhanced audio signals. In one embodiment, the process of FIG. 5A is performed by a mobile device, such as mobile device 19 in FIG. 1.

In step 502, one or more sounds from an environment are acquired. The one or more sounds may be acquired using one or more microphones (or a microphone array) associated with an HMD. The one or more microphones may be arranged in a predetermined layout and be used to capture sounds from various directions and/or originating from different points within an environment (e.g., speech sounds associated with an active speaker in a room). In some cases, the one or more sounds may be acquired by capturing the one or more sounds using a capture device, such as capture device 20 in FIG. 3. The one or more sounds may be captured as analog signals and digitized through the use of an analog-to-digital converter.

In step 504, one or more sources of sound within the environment are identified. The one or more sources of sound may include a first sound source and a second sound source different from the first sound source. In one embodiment, the first sound source may comprise a particular person and the second sound source may comprise a dog (or other animal). In some embodiments, a particular source of sound may be identified using sound recognition and/or voice recognition techniques (e.g., a particular person may be identified using characteristics associated with the sound of their voice). The particular source of sound may also be identified using image processing techniques (e.g., an HMD may correlate sounds originating from a particular direction with a particular person identified within an environment).

In step 506, a priority level is assigned to each of the one or more sources of sound. The priority level may be dynamically assigned depending on whether an end user of an HMD is focusing on a particular source of sound (e.g., the end user is looking at the particular source of sound), has been focusing on the particular source of sound for at least a particular period of time (e.g., has focused on the particular source of sound for at least 2 minutes within the last 10 minutes), or has specified a predetermined level of importance corresponding with the particular source of sound (e.g., the end user has specified that the particular source of sound is a high priority source in a user profile associated with the end user). In one embodiment, the assignment of priority levels to each of the one or more sources of sound may be updated periodically (e.g., the priority levels may be assigned every 5 minutes). One embodiment of a process for assigning a priority level to a particular source of sound is described later in reference to FIG. 5B.

In step 508, a first direction and a first sound level associated with the first sound source may be determined. In step 510, a second direction and a second sound level associated with the second sound source may be determined. In some cases, the first sound source may correspond with a first person within an environment and the second sound source may correspond with a second person within the environment different from the first person. A particular direction associated with a particular sound source (e.g., the first direction of step 508 or the second direction of step 510) may be represented by a particular angle relative to an orientation of an HMD and a particular degree of confidence as to the determination of the particular angle. In one embodiment, the particular direction may be determined using sound source localization. Sound source localization techniques may be used to localize the direction of a sound source by detecting time differences in the arrival time of different sounds due to the speed of sound being captured by a plurality of microphones associated with the HMD. Sound source localization techniques may also include performing pattern matching on each of the audio signals received by each of the plurality of microphones. The particular direction may be represented by a one-dimension localization (e.g., an angle representing a plane in which a particular source of sound is located), two-dimension localization (e.g., a vector representing an angle and an elevation), or a three-dimension localization (e.g., locating a point in three-dimension space associated with a particular source of sound).

In some embodiments, a particular direction associated with a particular sound source may be determined by performing skeletal tracking utilizing one or more images captured by an HMD in combination with source sound localization and/or voice recognition techniques. For example, an HMD may perform skeletal tracking to detect one or more active skeletons within an environment, perform facial recognition or object recognition to determine one or more persons associated with the one or more active skeletons, and perform voice recognition techniques on sounds originating from one or more directions within the environment in order to identify a particular person and a corresponding particular direction associated with the particular person. In one embodiment, a direction associated with a particular person may be tracked in real-time by applying both skeletal tracking and voice recognition. More information regarding skeletal tracking can be found in U.S. Pat. No. 8,744,121, "Device for Identifying and Tracking Multiple Humans over Time," issued Jun. 3, 2014, incorporated herein by reference in its entirety.

In step 512, one or more weighting coefficients corresponding with the one or more sources of sound are determined. The one or more weighting coefficients may weigh or be used to modify sound levels associated with sounds originating from or received from the one or more sources of sound. In one embodiment, a first set of the one or more weighting coefficients may increase sound levels associated with a first set of sound sources of the one or more sources of sound and a second set of the one or more weighting coefficients may decrease sound levels associated with a second set of sound sources of the one or more sources of sound. In one embodiment, a first weighting coefficient of the one or more weighting coefficients may be used to modify the first sound level and a second weighting coefficient of the one or more weighting coefficients may be used to modify the second sound level. One embodiment of a process for determining one or more weighting coefficients corresponding with one or more sources of sound is described later in reference to FIG. 5C.

In step 514, the first sound level and the second sound level are adjusted based on the one or more weighting coefficients determined in step 512. In one embodiment, the first sound level may be reduced in order to attenuate audio signals associated with the first sound source and the second sound level may be increased in order to amplify audio signals associated with the second sound source. In some embodiments, the first sound level may be maintained, while the second sound level may be reduced in order to attenuate or suppress sounds originating from the second sound source. In step 516, one or more enhanced audio signals are generated and outputted based on the first sound level and the second sound level. The one or more enhanced audio signals may be generated by applying audio signal processing techniques to sounds received from the one or more sources of sound based on priority levels assigned to the one or more sources of sound. The one or more enhanced audio signals may be outputted by driving the one or more enhanced audio signals to earphones (or other audio output devices) associated with an HMD. The one or more enhanced audio signals may comprise mono audio signals or stereo audio signals. In one embodiment, the one or more enhanced audio signals comprise two stereo audio signals. One embodiment of a process for generating and outputting one or more enhanced audio signals is described later in reference to FIG. 5D.

Figure 5B:
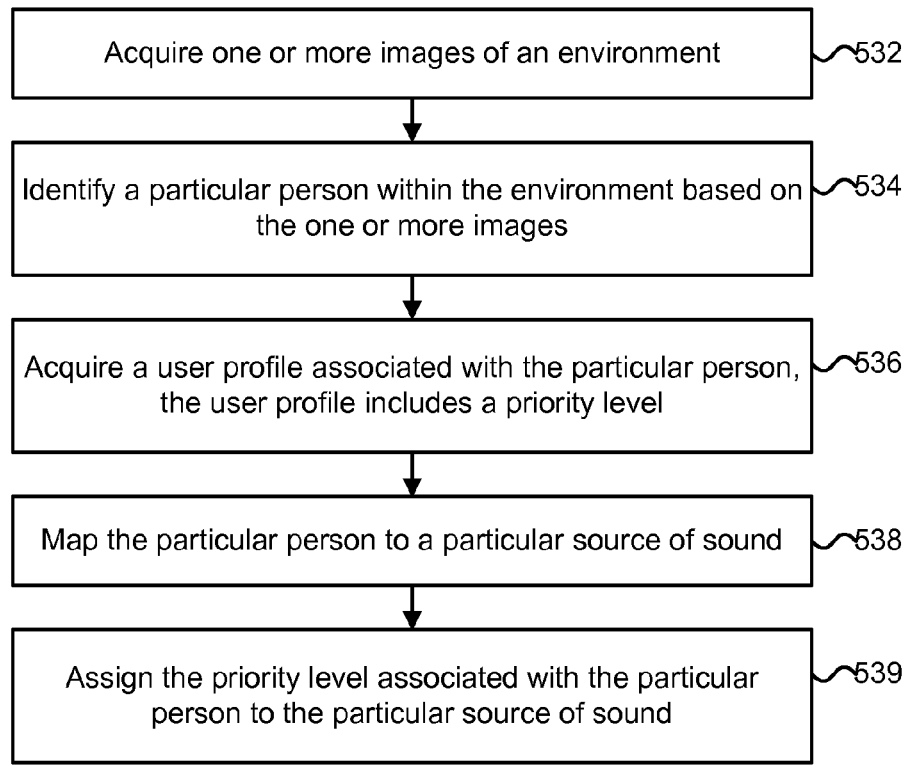
FIG. 5B is a flowchart describing one embodiment of a process for assigning a priority level to a particular source of sound.

FIG. 5B is a flowchart describing one embodiment of a process for assigning a priority level to a particular source of sound. The process described in FIG. 5B is one example of a process for implementing step 506 in FIG. 5A. In one embodiment, the process of FIG. 5B is performed by a mobile device, such as mobile device 19 in FIG. 1.

In step 532, one or more images of an environment are acquired. The one or more images may be captured using a capture device, such as capture device 20 in FIG. 3. In step 534, a particular person may be identified within the environment based on the one or more images. The particular person may be identified by applying facial recognition techniques and/or object recognition techniques to the one or more images. In step 536, a user profile associated with the particular person is acquired. The user profile may be stored locally on an HMD or acquired from a user profile server, such as user profile server 15 in FIG. 1. The user profile may include a priority level associated with the particular person. In some cases, the user profile may correspond with an end user of an HMD and include priority levels corresponding with one or more identifiable persons.

In step 538, the particular person may be mapped to a particular source of sound within the environment. In one embodiment, an HMD may identify a particular source of sound within an environment (e.g., via voice recognition or image recognition) and correlate or map the particular person to the particular source of sound based on the identification of the particular source of sound. In step 539, the priority level associated with the particular person may be assigned to the particular source of sound.

Figure 5C:
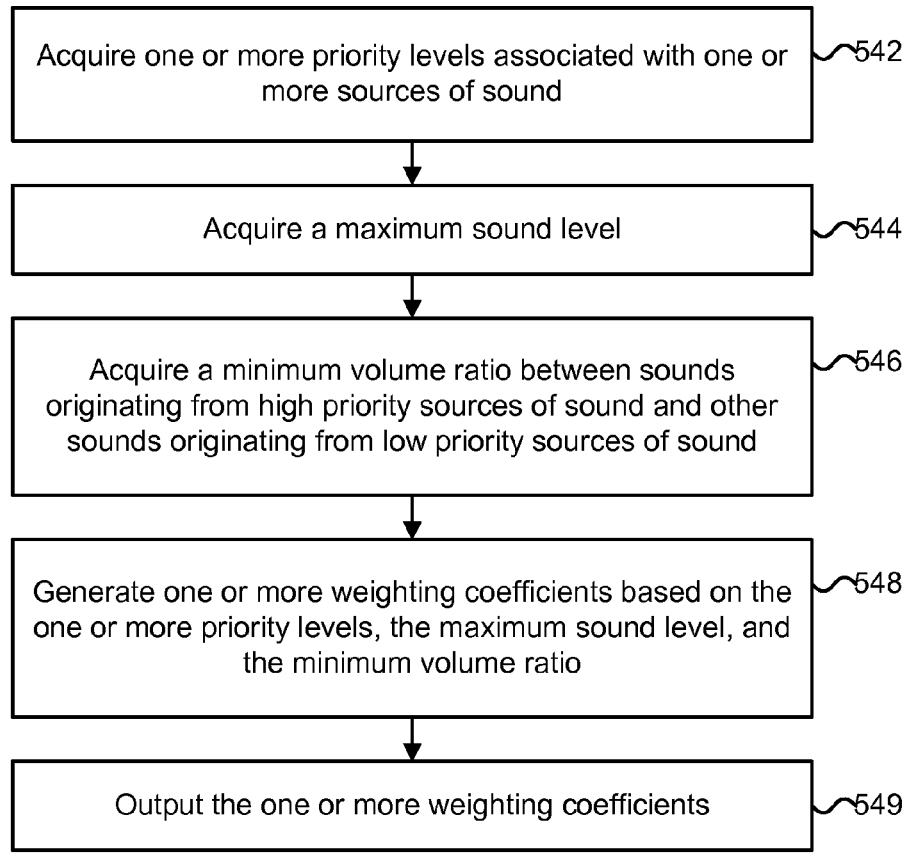
FIG. 5C is a flowchart describing one embodiment of a process for determining one or more weighting coefficients corresponding with one or more sources of sound.

FIG. 5C is a flowchart describing one embodiment of a process for determining one or more weighting coefficients corresponding with one or more sources of sound. The process described in FIG. 5C is one example of a process for implementing step 512 in FIG. 5A. In one embodiment, the process of FIG. 5C is performed by a mobile device, such as mobile device 19 in FIG. 1.

In step 542, one or more priority levels associated with one or more sources of sound are acquired. In step 544, a maximum sound level is acquired. The maximum sound level may correspond with a maximum sound volume that is deemed safe for hearing. In step 546, a minimum volume ratio between sounds originating from high priority sources of sound and other sounds originating from low priority sources of sound is acquired. The minimum volume ratio may correspond with a minimum volume ratio that is deemed sufficient for high priority sounds to be heard over low priority sounds.

In step 548, one or more weighting coefficients are generated based on the one or more priority levels, the maximum sound level, and the minimum volume ratio. The one or more weighting coefficients may provide scaling values for one or more sound levels associated with sounds originating from or received from the one or more sources of sound such that no sound level of the one or more sound levels is greater than the maximum sound level and the minimum volume ratio is satisfied. In step 549, the one or more weighting coefficients are outputted.

Figure 5D:
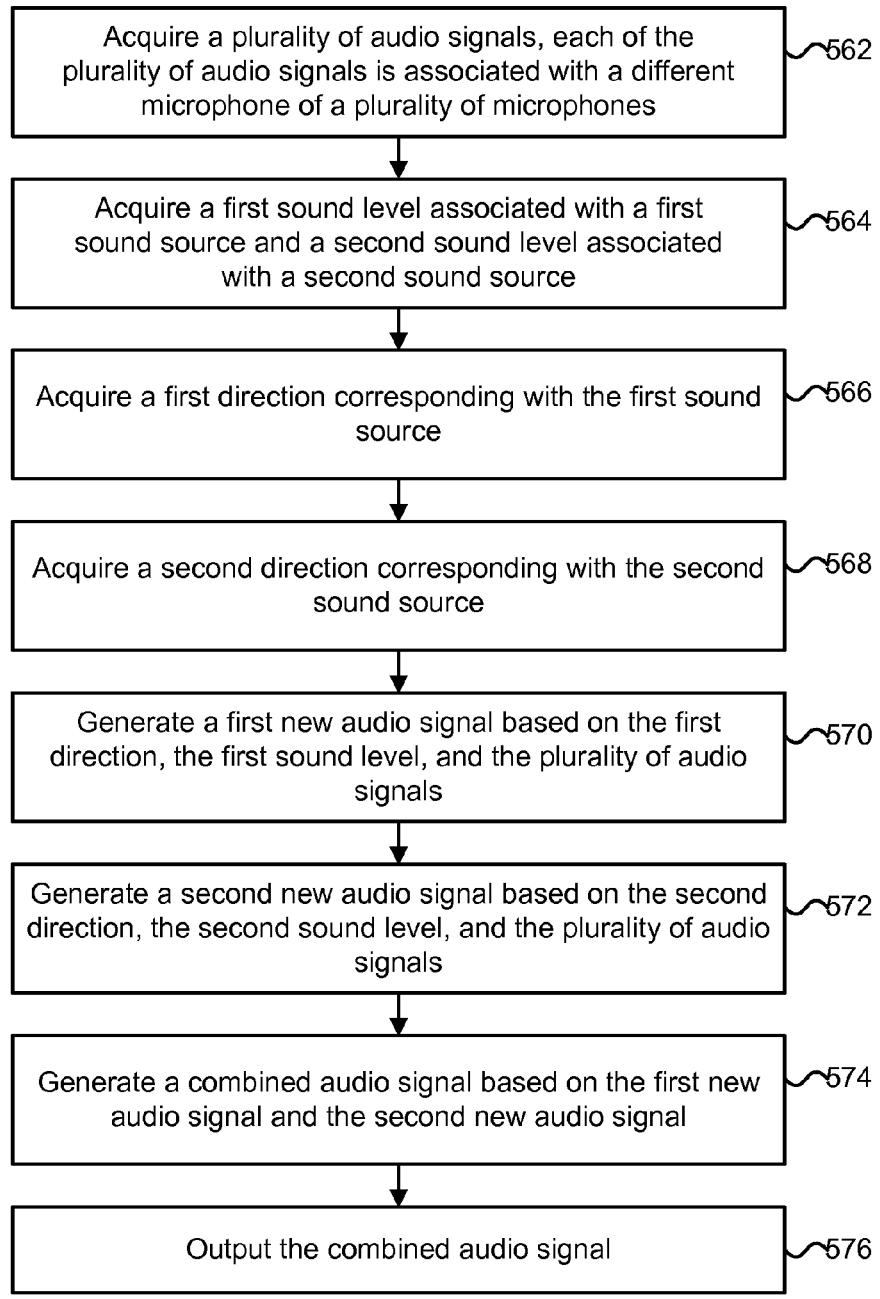
FIG. 5D is a flowchart describing one embodiment of a process for generating and outputting one or more enhanced audio signals.

FIG. 5D is a flowchart describing one embodiment of a process for generating and outputting one or more enhanced audio signals. The process described in FIG. 5D is one example of a process for implementing step 516 in FIG. 5A. In one embodiment, the process of FIG. 5D is performed by a mobile device, such as mobile device 19 in FIG. 1.

In step 562, a plurality of audio signals is acquired. Each of the plurality of audio signals may be associated with a different microphone of a plurality of microphones associated with an HMD. In step 564, a first sound level associated with a first sound source and a second sound level associated with a second sound source are acquired. In step 566, a first direction corresponding with the first sound source is acquired. In one embodiment, the first direction may be determined using sound source localization techniques as applied to the plurality of audio signals. In step 568, a second direction corresponding with the second sound source is acquired. In one embodiment, the second direction may be determined using sound source localization techniques as applied to the plurality of audio signals.

In step 570, a first new audio signal is generated based on the first direction, the first sound level, and the plurality of audio signals. In one embodiment, the first new audio signal may be generated using beamforming techniques as applied to the plurality of audio signals based on the first direction. The first sound level associated with the first new audio signal may be modified using equalization or audio volume adjustment techniques.

In step 572, a second new audio signal is generated based on the second direction, the second sound level, and the plurality of audio signals. In one embodiment, the second new audio signal may be generated using beamforming techniques as applied to the plurality of audio signals based on the second direction. The second sound level associated with the second new audio signal may be modified using equalization or audio volume adjustment techniques.

In step 574, a combined audio signal based on the first new audio signal and the second new audio signal is generated. In one embodiment, the combined audio signal may be generated using a programmable audio mixer. In step 576, the combined audio signal is outputted.

Figure 6:
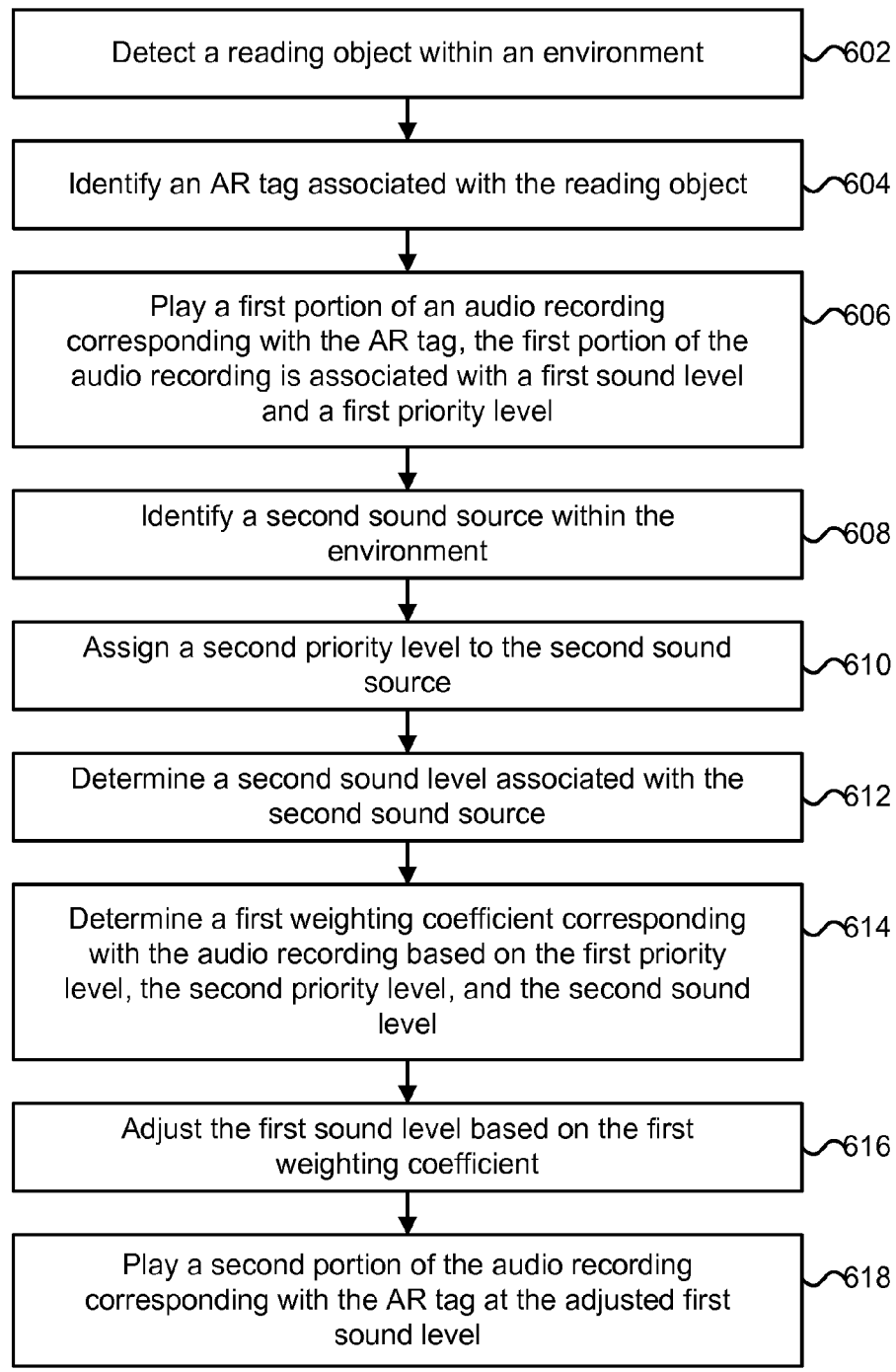
FIG. 6 is a flowchart describing one embodiment of a process for dynamically adjusting a sound level associated with an audio recording.

FIG. 6 is a flowchart describing one embodiment of a process for dynamically adjusting a sound level associated with an audio recording. In one embodiment, the process of FIG. 6 is performed by a mobile device, such as mobile device 19 in FIG. 1.

In step 602, a reading object is detected within an environment. The reading object may comprise a book, magazine, or piece of literature. In step 604, an AR tag associated with the reading object is identified. The AR tag may be associated with a particular page of the reading object and may correspond with a particular audio recording. In step 606, a first portion of an audio recording corresponding with the AR tag is played. In one embodiment, the audio recording may be played on an HMD. The first portion of the audio recording may be associated with a first sound level and a first priority level.

In step 608, a second sound source is identified within the environment. In one embodiment, the second sound source may comprise a particular person within the environment. The second sound source may be identified using sound recognition and/or voice recognition techniques (e.g., a particular person may be identified using characteristics associated with the sound of their voice). In step 610, a second priority level is assigned to the second sound source. In one embodiment, the second priority level may be dynamically assigned depending on whether an end user of an HMD is focusing on the second sound source. In another embodiment, the second priority level may be assigned based on a predetermined level of importance corresponding with the second sound source (e.g., as specified in a user profile associated with the end user of the HMD).

In step 612, a second sound level associated with the second sound source is determined. In step 614, a first weighting coefficient corresponding with the audio recording is determined based on the first priority level, the second priority level, and the second sound level. In one embodiment, if the second priority level is higher than the first priority level, then the first weighting coefficient may be associated with a reduction in the first sound level of the audio recording. In step 616, the first sound level is adjusted based on the first weighting coefficient. In step 618, a second portion of the audio recording corresponding with the AR tag is played at the adjusted first sound level.

One embodiment of the disclosed technology includes capturing at a mobile device one or more sounds from an environment and identifying one or more sources of sound within the environment based on the one or more sounds. The one or more sources of sound include a first sound source and a second sound source different from the first sound source. The method further includes assigning a first priority level to the first sound source, assigning a second priority level to the second sound source, determining a first sound level associated with the first sound source, determining a second sound level associated with the second sound source, determining one or more weighting coefficients based on the first priority level and the second priority level, generating one or more enhanced audio signals based on the one or more weighting coefficients, and outputting the one or more enhanced audio signals from the mobile device.

One embodiment of the disclosed technology includes detecting a reading object within an environment, identifying an AR tag associated with the reading object, and playing a first portion of an audio recording corresponding with the AR tag. The first portion of the audio recording is associated with a first sound level and a first priority level. The playing a first portion is performed by a mobile device. The method further includes identifying a second sound source within the environment, assigning a second priority level to the second sound source subsequent to the playing a first portion, determining a first weighting coefficient based on the first priority level and the second priority level, adjusting the first sound level based on the first weighting coefficient, and playing a second portion of the audio recording corresponding with the AR tag at the first sound level subsequent to the adjusting the first sound level.

One embodiment of the disclosed technology includes a plurality of microphones, one or more processors, and an audio output device. The plurality of microphones captures one or more sounds from an environment. The one or more processors identify one or more sources of sound within the environment based on the one or more sounds. The one or more sources of sound include a first sound source and a second sound source different from the first sound source. The one or more processors assign a first priority level to the first sound source and a second priority level to the second sound source. The one or more processors determine a first sound level associated with the first sound source and a second sound level associated with the second sound source. The one or more processors determine one or more weighting coefficients based on the first priority level and the second priority level and generate one or more enhanced audio signals based on the one or more weighting coefficients. The audio output device outputs the one or more enhanced audio signals.

Figure 7:
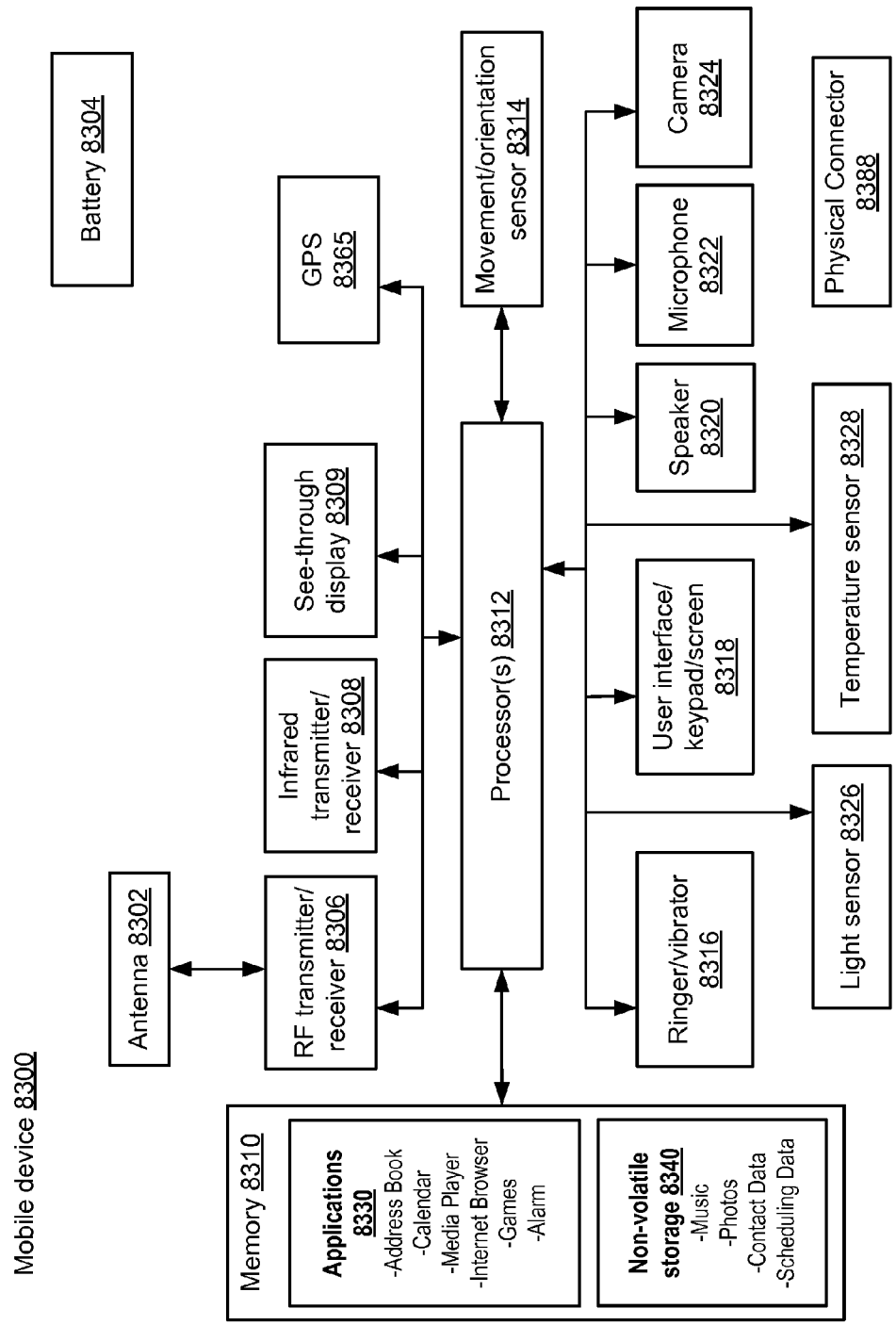
FIG. 7 is a block diagram of one embodiment of a mobile device.

FIG. 7 is a block diagram of one embodiment of a mobile device 8300, such as mobile device 19 in FIG. 1. Mobile devices may include laptop computers, pocket computers, mobile phones, personal digital assistants, and handheld media devices that have been integrated with wireless receiver/transmitter technology.

Mobile device 8300 includes one or more processors 8312 and memory 8310. Memory 8310 includes applications 8330 and non-volatile storage 8340. Memory 8310 can be any variety of memory storage media types, including non-volatile and volatile memory. A mobile device operating system handles the different operations of the mobile device 8300 and may contain user interfaces for operations, such as placing and receiving phone calls, text messaging, checking voicemail, and the like. The applications 8330 can be any assortment of programs, such as a camera application for photos and/or videos, an address book, a calendar application, a media player, an internet browser, games, an alarm application, and other applications. The non-volatile storage component 8340 in memory 8310 may contain data such as music, photos, contact data, scheduling data, and other files.

The one or more processors 8312 are in communication with a see-through display 8309. The see-through display 8309 may display one or more virtual objects associated with a real-world environment. The one or more processors 8312 also communicate with RF transmitter/receiver 8306 which in turn is coupled to an antenna 8302, with infrared transmitter/receiver 8308, with global positioning service (GPS) receiver 8365, and with movement/orientation sensor 8314 which may include an accelerometer and/or magnetometer. RF transmitter/receiver 8306 may enable wireless communication via various wireless technology standards such as Bluetooth® or the IEEE 802.11 standards. Accelerometers have been incorporated into mobile devices to enable applications such as intelligent user interface applications that let users input commands through gestures, and orientation applications which can automatically change the display from portrait to landscape when the mobile device is rotated. An accelerometer can be provided, e.g., by a micro-electro-mechanical system (MEMS) which is a tiny mechanical device (of micrometer dimensions) built onto a semiconductor chip. Acceleration direction, as well as orientation, vibration, and shock can be sensed. The one or more processors 8312 further communicate with a ringer/vibrator 8316, a user interface keypad/screen 8318, a speaker 8320, a microphone 8322, a camera 8324, a light sensor 8326, and a temperature sensor 8328. The user interface keypad/screen may include a touch-sensitive screen display.

The one or more processors 8312 control transmission and reception of wireless signals. During a transmission mode, the one or more processors 8312 provide voice signals from microphone 8322, or other data signals, to the RF transmitter/receiver 8306. The transmitter/receiver 8306 transmits the signals through the antenna 8302. The ringer/vibrator 8316 is used to signal an incoming call, text message, calendar reminder, alarm clock reminder, or other notification to the user. During a receiving mode, the RF transmitter/receiver 8306 receives a voice signal or data signal from a remote station through the antenna 8302. A received voice signal is provided to the speaker 8320 while other received data signals are processed appropriately.

Additionally, a physical connector 8388 may be used to connect the mobile device 8300 to an external power source, such as an AC adapter or powered docking station, in order to recharge battery 8304. The physical connector 8388 may also be used as a data connection to an external computing device. The data connection allows for operations such as synchronizing mobile device data with the computing data on another device.

The disclosed technology is operational with numerous other general purpose or special purpose computing system environments or configurations. Examples of well-known computing systems, environments, and/or configurations that may be suitable for use with the technology include, but are not limited to, personal computers, server computers, handheld or laptop devices, multiprocessor systems, microprocessor-based systems, set top boxes, programmable consumer electronics, network PCs, minicomputers, mainframe computers, distributed computing environments that include any of the above systems or devices, and the like.

The disclosed technology may be described in the general context of computer-executable instructions, such as program modules, being executed by a computer. Generally, software and program modules as described herein include routines, programs, objects, components, data structures, and other types of structures that perform particular tasks or implement particular abstract data types. Hardware or combinations of hardware and software may be substituted for software modules as described herein.

The disclosed technology may also be practiced in distributed computing environments where tasks are performed by remote processing devices that are linked through a communications network. In a distributed computing environment, program modules may be located in both local and remote computer storage media including memory storage devices.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for adjusting sound levels based on contextual information, comprising:
   capturing at a mobile device one or more sounds from an environment using a microphone array, the mobile device comprises a head-mounted display device;
   identifying one or more sources of sound within the environment based on the one or more sounds captured using the microphone array, the one or more sources of sound include a first sound source and a second sound source different from the first sound source, the first sound source comprises a particular person, the second sound source comprises a second person different from the particular person;
   determining a location of the mobile device, the location of the mobile device is determined using GPS location information corresponding with the location of the mobile device;
   determining using one or more processors an identification of the particular person;
   assigning a first priority level to the first sound source based on the location of the mobile device and the identification of the particular person, the assigning the first priority level to the first sound source includes determining whether an end user of the mobile device has gazed at the particular person for at least a particular period of time;
   assigning a second priority level to the second sound source based on the location of the mobile device;
   determining one or more weighting coefficients based on the first priority level and the second priority level, the determining one or more weighting coefficients is performed by the mobile device;
   generating using the one or more processors one or more enhanced audio signals based on the one or more weighting coefficients and the one or more sounds captured using the microphone array, the generating the one or more enhanced audio signals is performed by the mobile device; and
   outputting the one or more enhanced audio signals from the mobile device.

2. The method of claim 1, wherein:
   the assigning the first priority level to the first sound source includes determining whether the end user of the mobile device is gazing at the particular person.

3. The method of claim 1, wherein:
   the assigning the first priority level to the first sound source includes acquiring a user profile associated with the particular person in response to determining the identification of the particular person and assigning the first priority level to the first sound source based on a priority level specified by the user profile.

4. The method of claim 1, wherein:
   the identifying one or more sources of sound includes identifying the first sound source using voice recognition techniques.

5. The method of claim 1, further comprising:
   determining a first direction associated with the first sound source; and
   determining a second direction associated with the second sound source, the generating the one or more enhanced audio signals includes generating a first new audio signal based on the first direction using beamforming techniques and generating a second new audio signal based on the second direction using beamforming techniques, the generating the one or more enhanced audio signals includes generating a combined audio signal based on the first new audio signal and the second new audio signal.

6. The method of claim 1, wherein:
   the determining one or more weighting coefficients includes determining the one or more weighting coefficients such that a minimum volume ratio is maintained.

7. An electronic device for adjusting sound levels based on contextual information, comprising:
   a plurality of microphones configured to capture one or more sounds from an environment;
   one or more processors in communication with the plurality of microphones, the one or more processors configured to identify one or more sources of sound within the environment based on the one or more sounds captured using the plurality of microphones, the one or more sources of sound include a first sound source and a second sound source different from the first sound source, the first sound source comprises a particular person, the one or more processors configured to determine a location of the electronic device and determine an identification of the particular person, the one or more processors configured to assign a first priority level to the first sound source based on the location of the electronic device and the identification of the particular person and assign a second priority level to the second sound source based on the location of the electronic device, the one or more processors configured to assign the first priority level to the first sound source based on whether an end user of the electronic device has gazed at the particular person for at least a particular period of time, the one or more processors configured to determine one or more weighting coefficients based on the first priority level and the second priority level, the one or more processors configured to generate one or more enhanced audio signals based on the one or more weighting coefficients and the one or more sounds captured using the plurality of microphones; and
   an audio output device in communication with the one or more processors, the audio output device configured to output the one or more enhanced audio signals, the electronic device comprises a head-mounted display device.

8. The electronic device of claim 7, wherein:
   the one or more processors configured to assign the first priority level to the first sound source based on whether the end user of the electronic device is gazing at the particular person.

9. The electronic device of claim 7, wherein:
   the audio output device comprises earphones; and
   the one or more processors configured to identify the first sound source using voice recognition techniques.

10. An apparatus, comprising:

a microphone array configured to capture one or more sounds from an environment;

one or more processors configured to identify one or more sources of sound within the environment based on the one or more sounds captured using the microphone array, the one or more sources of sound include a first sound source and a second sound source different from the first sound source, the first sound source comprises a particular person, the one or more processors configured to determine a location of the apparatus and determine an identification of the particular person, the one or more processors configured to assign a first priority level to the first sound source based on the location of the apparatus and the identification of the particular person, the one or more processors configured to assign the first priority level to the first sound source in response to detecting that an end user of the apparatus has gazed at the particular person for at least a particular period of time, the one or more processors configured to assign a second priority level to the second sound source based on the location of the apparatus, the one or more processors configured to determine one or more weighting coefficients based on the first priority level and the second priority level, the one or more processors configured to generate one or more enhanced audio signals based on the one or more weighting coefficients and the one or more sounds captured using the microphone array; and an audio output device configured to output the one or more enhanced audio signals, the apparatus comprises a see-through head-mounted display device.

11. The apparatus of claim 10, wherein:

the location of the apparatus is determined using GPS location information corresponding with the location of the apparatus.

12. The apparatus of claim 10, wherein:

the apparatus comprises a mobile electronic device.

13. The apparatus of claim 10, wherein:

the second sound source comprises a second person different from the particular person.

14. The apparatus of claim 10, wherein:

the microphone array comprises a plurality of microphones.

15. The apparatus of claim 10, wherein:

the one or more processors configured to determine a first direction associated with the first sound source and determine a second direction associated with the second sound source, the one or more processors configured to generate a first new audio signal based on the first direction using beamforming techniques and generate a second new audio signal based on the second direction using beamforming techniques, the one or more processors configured to generate a combined audio signal based on the first new audio signal and the second new audio signal.

* * * * *